(12) United States Patent
Wiley et al.

(10) Patent No.: US 8,730,069 B2
(45) Date of Patent: *May 20, 2014

(54) DOUBLE DATA RATE SERIAL ENCODER

(75) Inventors: George A. Wiley, San Diego, CA (US); Brian Steele, Denver, CO (US); Curtis D. Musfeldt, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/937,913

(22) Filed: Nov. 9, 2007

(65) Prior Publication Data

US 2008/0088492 A1    Apr. 17, 2008

Related U.S. Application Data

(63) Continuation of application No. 11/285,397, filed on Nov. 23, 2005, now Pat. No. 7,315,265.

(51) Int. Cl.
*H03M 9/00*    (2006.01)
(52) U.S. Cl.
USPC ............ 341/100; 341/101; 341/141; 326/39; 326/41; 326/53; 375/224; 375/355
(58) Field of Classification Search
USPC ................. 341/100, 101, 141; 326/39, 41, 53
See application file for complete search history.

(56) References Cited

U.S. PATENT DOCUMENTS

| | | | |
|---|---|---|---|
| 3,594,304 A | 7/1971 | Seitzer | |
| 4,042,783 A | 8/1977 | Gindi | |
| 4,363,123 A | 12/1982 | Grover | |
| 4,393,444 A | 7/1983 | Weinberg | |
| 4,491,943 A | 1/1985 | Iga et al. | |
| 4,660,096 A | 4/1987 | Arlan et al. | |
| 4,764,805 A | 8/1988 | Rabbani et al. | |
| 4,769,761 A | 9/1988 | Downes et al. | |
| 4,812,296 A | 3/1989 | Schmelz et al. | |
| 4,821,296 A | 4/1989 | Cordell | |
| 4,891,805 A | 1/1990 | Fallin | |
| 5,079,693 A | 1/1992 | Miller | |

(Continued)

FOREIGN PATENT DOCUMENTS

| CN | 88101302 A | 10/1988 |
|---|---|---|
| CN | 1234709 A | 11/1999 |

(Continued)

OTHER PUBLICATIONS

Video Electronics Standards Association (VESA), "Mobile Display Digital Interface Standard (MDDI)", Jul. 2004. cited by other.

(Continued)

*Primary Examiner* — Linh Nguyen
(74) *Attorney, Agent, or Firm* — Nicholas J. Pauley; Peter Michael Kamarchik; Joseph Agusta

(57) ABSTRACT

A double data rate serial encoder is provided. The serial encoder comprises a mux having a plurality of inputs, a plurality of latches coupled to the inputs of the mux, an enabler to enable the latches to update their data inputs, and a counter to select one of the plurality of inputs of the mux for output. In another aspect, the mux provides a glitch-less output during input transitions. The mux includes an output selection algorithm optimized based on a priori knowledge of an input selection sequence provided by the counter.

28 Claims, 10 Drawing Sheets

(56) References Cited

U.S. PATENT DOCUMENTS

| | | |
|---|---|---|
| 5,111,455 A | 5/1992 | Negus |
| 5,131,012 A | 7/1992 | Dravida |
| 5,138,616 A | 8/1992 | Wagner, Jr. et al. |
| 5,155,590 A | 10/1992 | Beyers, II et al. |
| 5,167,035 A | 11/1992 | Mann et al. |
| 5,224,213 A | 6/1993 | Dieffenderfer et al. |
| 5,227,783 A | 7/1993 | Shaw et al. |
| 5,231,636 A | 7/1993 | Rasmussen |
| 5,331,642 A | 7/1994 | Valley et al. |
| 5,345,542 A | 9/1994 | Wye |
| 5,359,595 A | 10/1994 | Weddle et al. |
| 5,377,188 A | 12/1994 | Seki |
| 5,396,636 A | 3/1995 | Gallagher et al. |
| 5,418,452 A | 5/1995 | Pyle |
| 5,418,952 A | 5/1995 | Morley et al. |
| 5,420,858 A | 5/1995 | Marshall et al. |
| 5,422,894 A | 6/1995 | Abe et al. |
| 5,430,486 A | 7/1995 | Fraser et al. |
| 5,477,534 A | 12/1995 | Kusano |
| 5,483,185 A | 1/1996 | Scriber et al. |
| 5,490,247 A | 2/1996 | Tung et al. |
| 5,502,499 A | 3/1996 | Birch et al. |
| 5,510,832 A | 4/1996 | Garcia |
| 5,513,185 A | 4/1996 | Schmidt |
| 5,519,830 A | 5/1996 | Opoczynski |
| 5,521,907 A | 5/1996 | Ennis, Jr. et al. |
| 5,524,007 A | 6/1996 | White et al. |
| 5,530,704 A | 6/1996 | Gibbons et al. |
| 5,535,336 A | 7/1996 | Smith et al. |
| 5,543,939 A | 8/1996 | Harvey et al. |
| 5,546,121 A | 8/1996 | Gotanda et al. |
| 5,550,489 A | 8/1996 | Raab |
| 5,559,459 A * | 9/1996 | Back et al. .................. 326/93 |
| 5,559,952 A | 9/1996 | Fujimoto |
| 5,560,022 A | 9/1996 | Dunstan et al. |
| 5,565,957 A | 10/1996 | Goto |
| 5,575,951 A | 11/1996 | Anderson |
| 5,604,450 A | 2/1997 | Borkar et al. |
| 5,619,650 A | 4/1997 | Bach et al. |
| 5,621,664 A | 4/1997 | Phaal |
| 5,646,947 A | 7/1997 | Cooper et al. |
| 5,664,948 A | 9/1997 | Dimitriadis et al. |
| 5,680,404 A | 10/1997 | Gray |
| 5,726,990 A | 3/1998 | Shimada et al. |
| 5,732,352 A | 3/1998 | Gutowski et al. |
| 5,733,131 A | 3/1998 | Park |
| 5,734,118 A | 3/1998 | Ashour et al. |
| 5,751,445 A | 5/1998 | Masunaga |
| 5,751,951 A | 5/1998 | Osborne et al. |
| 5,777,999 A | 7/1998 | Hiraki et al. |
| 5,790,551 A | 8/1998 | Chan |
| 5,798,720 A | 8/1998 | Yano |
| 5,802,351 A | 9/1998 | Frampton |
| 5,815,507 A | 9/1998 | Vinggaard et al. |
| 5,816,921 A | 10/1998 | Hosokawa |
| 5,818,255 A * | 10/1998 | New et al. .................. 326/39 |
| 5,822,603 A | 10/1998 | Hansen et al. |
| 5,844,918 A | 12/1998 | Kato |
| 5,847,752 A | 12/1998 | Sebestyen |
| 5,862,160 A | 1/1999 | Irvin et al. |
| 5,864,546 A | 1/1999 | Campanella |
| 5,867,501 A | 2/1999 | Horst et al. |
| 5,867,510 A | 2/1999 | Steele |
| 5,881,262 A | 3/1999 | Abramson et al. |
| 5,903,281 A | 5/1999 | Chen et al. |
| 5,935,256 A | 8/1999 | Lesmeister |
| 5,953,378 A | 9/1999 | Hotani et al. |
| 5,958,006 A | 9/1999 | Eggleston et al. |
| 5,963,557 A | 10/1999 | Eng |
| 5,963,564 A | 10/1999 | Petersen et al. |
| 5,963,979 A | 10/1999 | Inoue |
| 5,969,750 A | 10/1999 | Hsieh et al. |
| 5,982,362 A | 11/1999 | Crater et al. |
| 5,983,261 A | 11/1999 | Riddle |
| 5,990,852 A | 11/1999 | Szamrej |
| 5,990,902 A | 11/1999 | Park |
| 5,995,512 A | 11/1999 | Pogue, Jr. |
| 6,002,709 A | 12/1999 | Hendrickson |
| 6,014,705 A | 1/2000 | Koenck et al. |
| 6,047,380 A | 4/2000 | Nolan et al. |
| 6,049,837 A | 4/2000 | Youngman |
| 6,055,247 A | 4/2000 | Kubota et al. |
| 6,064,649 A | 5/2000 | Johnston |
| 6,078,361 A | 6/2000 | Reddy |
| 6,081,513 A | 6/2000 | Roy |
| 6,091,709 A | 7/2000 | Harrison et al. |
| 6,092,231 A | 7/2000 | Sze |
| 6,097,401 A | 8/2000 | Owen et al. |
| 6,101,601 A | 8/2000 | Matthews et al. |
| 6,117,681 A | 9/2000 | Salmons et al. |
| 6,118,791 A | 9/2000 | Fichou et al. |
| 6,151,067 A | 11/2000 | Suemoto et al. |
| 6,151,320 A | 11/2000 | Shim et al. |
| 6,154,156 A * | 11/2000 | Tagato .................. 341/79 |
| 6,154,466 A | 11/2000 | Iwasaki et al. |
| 6,185,601 B1 | 2/2001 | Wolff |
| 6,192,230 B1 | 2/2001 | Van Bokhorst et al. |
| 6,198,752 B1 | 3/2001 | Lee |
| 6,199,169 B1 | 3/2001 | Voth |
| 6,222,677 B1 | 4/2001 | Budd et al. |
| 6,236,647 B1 | 5/2001 | Amalfitano |
| 6,242,953 B1 | 6/2001 | Thomas |
| 6,243,596 B1 | 6/2001 | Kikinis et al. |
| 6,243,761 B1 | 6/2001 | Mogul et al. |
| 6,246,876 B1 | 6/2001 | Hontzeas |
| 6,252,526 B1 | 6/2001 | Uyehara |
| 6,252,888 B1 | 6/2001 | Fite, Jr. et al. |
| 6,256,509 B1 | 7/2001 | Tanaka et al. |
| 6,288,739 B1 | 9/2001 | Hales et al. |
| 6,297,684 B1 | 10/2001 | Uyehara et al. |
| 6,308,239 B1 | 10/2001 | Osakada et al. |
| 6,335,696 B1 | 1/2002 | Aoyagi et al. |
| 6,359,479 B1 * | 3/2002 | Oprescu .................. 327/141 |
| 6,363,439 B1 | 3/2002 | Battles et al. |
| 6,393,008 B1 | 5/2002 | Cheng et al. |
| 6,397,286 B1 | 5/2002 | Chatenever et al. |
| 6,400,392 B1 | 6/2002 | Yamaguchi et al. |
| 6,400,654 B1 | 6/2002 | Sawamura et al. |
| 6,400,754 B2 | 6/2002 | Fleming et al. |
| 6,421,735 B1 | 7/2002 | Jung et al. |
| 6,429,867 B1 | 8/2002 | Deering |
| 6,430,196 B1 | 8/2002 | Baroudi |
| 6,430,606 B1 | 8/2002 | Haq |
| 6,434,187 B1 | 8/2002 | Beard et al. |
| 6,438,363 B1 | 8/2002 | Feder et al. |
| 6,457,090 B1 | 9/2002 | Young |
| 6,475,245 B2 | 11/2002 | Gersho et al. |
| 6,477,186 B1 | 11/2002 | Nakura et al. |
| 6,480,521 B1 | 11/2002 | Odenwalder et al. |
| 6,483,825 B2 | 11/2002 | Seta |
| 6,487,217 B1 | 11/2002 | Baroudi |
| 6,493,357 B1 | 12/2002 | Fujisaki |
| 6,493,713 B1 | 12/2002 | Kanno |
| 6,493,824 B1 | 12/2002 | Novoa et al. |
| 6,545,979 B1 | 4/2003 | Poulin |
| 6,549,538 B1 | 4/2003 | Beck et al. |
| 6,549,958 B1 | 4/2003 | Kuba |
| 6,574,211 B2 | 6/2003 | Padovani et al. |
| 6,583,809 B1 | 6/2003 | Fujiwara |
| 6,594,304 B2 * | 7/2003 | Chan .................. 375/220 |
| 6,609,167 B1 | 8/2003 | Bastiani et al. |
| 6,611,221 B1 | 8/2003 | Soundarapandian et al. |
| 6,611,503 B1 | 8/2003 | Fitzgerald et al. |
| 6,618,360 B1 | 9/2003 | Scoville et al. |
| 6,621,809 B1 | 9/2003 | Lee et al. |
| 6,621,851 B1 | 9/2003 | Agee et al. |
| 6,636,508 B1 | 10/2003 | Li et al. |
| 6,636,922 B1 | 10/2003 | Bastiani et al. |
| 6,662,322 B1 | 12/2003 | Abdelilah et al. |
| 6,690,201 B1 | 2/2004 | Simkins et al. |
| 6,714,233 B2 | 3/2004 | Chihara et al. |
| 6,715,088 B1 | 3/2004 | Togawa |
| 6,728,263 B2 | 4/2004 | Joy et al. |
| 6,738,344 B1 | 5/2004 | Bunton et al. |

(56) References Cited

U.S. PATENT DOCUMENTS

| | | |
|---|---|---|
| 6,745,364 B2 | 6/2004 | Bhatt et al. |
| 6,754,179 B1 | 6/2004 | Lin |
| 6,760,722 B1 | 7/2004 | Raghunandan |
| 6,760,772 B2 * | 7/2004 | Zou et al. ................ 709/230 |
| 6,760,882 B1 | 7/2004 | Gesbert et al. |
| 6,765,506 B1 | 7/2004 | Lu |
| 6,771,613 B1 | 8/2004 | O'Toole et al. |
| 6,778,493 B1 | 8/2004 | Ishii |
| 6,782,039 B2 | 8/2004 | Alamouti et al. |
| 6,784,941 B1 | 8/2004 | Su et al. |
| 6,791,379 B1 * | 9/2004 | Wakayama et al. ........ 327/156 |
| 6,797,891 B1 | 9/2004 | Blair et al. |
| 6,804,257 B1 | 10/2004 | Benayoun et al. |
| 6,810,084 B1 | 10/2004 | Jun et al. |
| 6,813,638 B1 | 11/2004 | Sevanto et al. |
| 6,816,929 B2 | 11/2004 | Ueda |
| 6,831,685 B1 | 12/2004 | Ueno et al. |
| 6,836,469 B1 | 12/2004 | Wu |
| 6,850,282 B1 | 2/2005 | Makino et al. |
| 6,865,240 B1 | 3/2005 | Kawataka |
| 6,865,609 B1 | 3/2005 | Gubbi et al. |
| 6,865,610 B2 | 3/2005 | Bolosky et al. |
| 6,867,668 B1 | 3/2005 | Dagostino et al. |
| 6,882,361 B1 | 4/2005 | Gaylord |
| 6,886,035 B2 | 4/2005 | Wolff |
| 6,892,071 B2 | 5/2005 | Park |
| 6,894,994 B1 | 5/2005 | Grob et al. |
| 6,895,410 B2 | 5/2005 | Ridge |
| 6,897,891 B2 | 5/2005 | Itsukaichi |
| 6,906,762 B1 | 6/2005 | Witehira |
| 6,927,746 B2 | 8/2005 | Lee et al. |
| 6,944,136 B2 | 9/2005 | Kim et al. |
| 6,947,436 B2 | 9/2005 | Harris et al. |
| 6,950,428 B1 | 9/2005 | Horst et al. |
| 6,956,829 B2 | 10/2005 | Lee |
| 6,973,039 B2 | 12/2005 | Redi et al. |
| 6,973,062 B1 | 12/2005 | Han |
| 6,975,145 B1 | 12/2005 | Vadi et al. |
| 6,990,549 B2 | 1/2006 | Main et al. |
| 6,993,393 B2 | 1/2006 | Von Arx et al. |
| 6,999,432 B2 | 2/2006 | Zhang et al. |
| 7,003,796 B1 | 2/2006 | Humpleman et al. |
| 7,010,607 B1 | 3/2006 | Bunton |
| 7,012,636 B2 | 3/2006 | Hatanaka |
| 7,015,838 B1 | 3/2006 | Groen et al. |
| 7,023,924 B1 | 4/2006 | Keller et al. |
| 7,030,796 B2 * | 4/2006 | Shim et al. ............... 341/141 |
| 7,036,066 B2 | 4/2006 | Weibel et al. |
| 7,042,914 B2 | 5/2006 | Zerbe et al. |
| 7,047,475 B2 | 5/2006 | Sharma et al. |
| 7,051,218 B1 | 5/2006 | Gulick et al. |
| 7,062,264 B2 | 6/2006 | Ko et al. |
| 7,062,579 B2 | 6/2006 | Tateyama et al. |
| 7,068,666 B2 | 6/2006 | Foster et al. |
| 7,095,435 B1 | 8/2006 | Hartman et al. |
| 7,110,420 B2 | 9/2006 | Bashirullah et al. |
| 7,126,945 B2 | 10/2006 | Beach |
| 7,138,989 B2 | 11/2006 | Mendelson et al. |
| 7,143,177 B1 | 11/2006 | Johnson et al. |
| 7,143,207 B2 | 11/2006 | Vogt |
| 7,145,411 B1 | 12/2006 | Blair et al. |
| 7,151,940 B2 | 12/2006 | Diao |
| 7,158,536 B2 | 1/2007 | Ching et al. |
| 7,158,539 B2 | 1/2007 | Zhang et al. |
| 7,161,846 B2 | 1/2007 | Padaparambil |
| 7,165,112 B2 | 1/2007 | Battin et al. |
| 7,178,042 B2 | 2/2007 | Sakagami |
| 7,180,951 B2 * | 2/2007 | Chan ....................... 375/257 |
| 7,184,408 B2 | 2/2007 | Denton et al. |
| 7,187,738 B2 | 3/2007 | Naven et al. |
| 7,191,281 B2 | 3/2007 | Bajikar |
| 7,219,294 B2 | 5/2007 | Vogt |
| 7,231,402 B2 | 6/2007 | Dickens |
| 7,251,231 B2 | 7/2007 | Gubbi |
| 7,257,087 B2 | 8/2007 | Grovenburg |
| 7,260,087 B2 | 8/2007 | Bao et al. |
| 7,269,153 B1 | 9/2007 | Schultz et al. |
| 7,274,652 B1 | 9/2007 | Webster et al. |
| 7,278,069 B2 | 10/2007 | Abrosimov et al. |
| 7,284,181 B1 | 10/2007 | Venkatramani |
| 7,301,968 B2 | 11/2007 | Haran et al. |
| 7,310,535 B1 | 12/2007 | MacKenzie et al. |
| 7,315,265 B2 * | 1/2008 | Wiley et al. ............... 341/100 |
| 7,315,520 B2 | 1/2008 | Xue et al. |
| 7,317,754 B1 | 1/2008 | Remy et al. |
| 7,327,735 B2 | 2/2008 | Robotham et al. |
| 7,336,139 B2 | 2/2008 | Blair et al. |
| 7,336,667 B2 | 2/2008 | Allen et al. |
| 7,340,548 B2 | 3/2008 | Love et al. |
| 7,349,973 B2 | 3/2008 | Saito et al. |
| 7,373,155 B2 | 5/2008 | Duan et al. |
| 7,383,350 B1 | 6/2008 | Moore et al. |
| 7,383,399 B2 | 6/2008 | Vogt |
| 7,392,541 B2 | 6/2008 | Largman et al. |
| 7,403,487 B1 | 7/2008 | Foladare et al. |
| 7,403,511 B2 | 7/2008 | Liang et al. |
| 7,405,703 B2 | 7/2008 | Qi et al. |
| 7,412,642 B2 | 8/2008 | Cypher |
| 7,430,001 B2 | 9/2008 | Fujii |
| 7,447,953 B2 | 11/2008 | Vogt |
| 7,451,362 B2 | 11/2008 | Chen et al. |
| 7,487,917 B2 | 2/2009 | Kotlarsky et al. |
| 7,508,760 B2 | 3/2009 | Akiyama et al. |
| 7,515,705 B2 | 4/2009 | Segawa et al. |
| 7,526,323 B2 | 4/2009 | Kim et al. |
| 7,536,598 B2 | 5/2009 | Largman et al. |
| 7,543,326 B2 | 6/2009 | Moni |
| 7,557,633 B2 | 7/2009 | Yu |
| 7,574,113 B2 | 8/2009 | Nagahara et al. |
| 7,595,834 B2 | 9/2009 | Kawai et al. |
| 7,634,607 B2 | 12/2009 | Honda |
| 7,643,823 B2 | 1/2010 | Shamoon et al. |
| 7,729,720 B2 | 6/2010 | Suh et al. |
| 7,800,600 B2 | 9/2010 | Komatsu et al. |
| 7,813,451 B2 | 10/2010 | Binder et al. |
| 7,831,127 B2 | 11/2010 | Wilkinson |
| 7,835,280 B2 | 11/2010 | Pang et al. |
| 7,844,296 B2 | 11/2010 | Yuki |
| 7,868,890 B2 | 1/2011 | Ludwin et al. |
| 7,873,343 B2 | 1/2011 | Gollnick et al. |
| 7,876,821 B2 | 1/2011 | Li et al. |
| 7,877,439 B2 | 1/2011 | Gallou et al. |
| 7,912,503 B2 | 3/2011 | Chang et al. |
| 7,945,143 B2 | 5/2011 | Yahata et al. |
| 7,949,777 B2 | 5/2011 | Wallace et al. |
| 8,031,130 B2 | 10/2011 | Tamura |
| 8,077,634 B2 | 12/2011 | Maggenti et al. |
| 8,325,239 B2 | 12/2012 | Kaplan et al. |
| 2001/0005385 A1 | 6/2001 | Ichiguchi et al. |
| 2001/0012293 A1 | 8/2001 | Petersen et al. |
| 2001/0032295 A1 | 10/2001 | Tsai et al. |
| 2001/0047450 A1 | 11/2001 | Gillingham et al. |
| 2001/0047475 A1 | 11/2001 | Terasaki |
| 2001/0053174 A1 | 12/2001 | Fleming et al. |
| 2001/0056513 A1 | 12/2001 | Ueda |
| 2002/0011998 A1 | 1/2002 | Tamura |
| 2002/0045448 A1 | 4/2002 | Park et al. |
| 2002/0071395 A1 | 6/2002 | Redi et al. |
| 2002/0131379 A1 | 9/2002 | Lee et al. |
| 2002/0140845 A1 | 10/2002 | Yoshida et al. |
| 2002/0146024 A1 | 10/2002 | Harris et al. |
| 2002/0188907 A1 | 12/2002 | Kobayashi |
| 2002/0193133 A1 | 12/2002 | Shibutani |
| 2003/0003943 A1 | 1/2003 | Bajikar et al. |
| 2003/0028647 A1 | 2/2003 | Grosu |
| 2003/0033417 A1 | 2/2003 | Zou et al. |
| 2003/0034955 A1 | 2/2003 | Gilder et al. |
| 2003/0035049 A1 | 2/2003 | Dickens et al. |
| 2003/0039212 A1 | 2/2003 | Lloyd et al. |
| 2003/0061431 A1 | 3/2003 | Mears et al. |
| 2003/0081557 A1 | 5/2003 | Mettala et al. |
| 2003/0086443 A1 | 5/2003 | Beach et al. |
| 2003/0091056 A1 | 5/2003 | Paul Hulme Walker et al. |
| 2003/0093607 A1 | 5/2003 | Main et al. |

(56) References Cited

U.S. PATENT DOCUMENTS

| | | |
|---|---|---|
| 2003/0125040 A1 | 7/2003 | Walton et al. |
| 2003/0144006 A1 | 7/2003 | Johansson et al. |
| 2003/0158979 A1 | 8/2003 | Tateyama et al. |
| 2003/0185220 A1 | 10/2003 | Valenci |
| 2003/0191809 A1 | 10/2003 | Mosley et al. |
| 2003/0193576 A1 | 10/2003 | Fujii |
| 2003/0194018 A1 | 10/2003 | Chang |
| 2003/0235209 A1 | 12/2003 | Garg et al. |
| 2004/0008631 A1 | 1/2004 | Kim |
| 2004/0024920 A1 | 2/2004 | Gulick et al. |
| 2004/0028415 A1 | 2/2004 | Eiselt |
| 2004/0049616 A1 | 3/2004 | Dunstan et al. |
| 2004/0073697 A1 | 4/2004 | Saito et al. |
| 2004/0082383 A1 | 4/2004 | Muncaster et al. |
| 2004/0100966 A1 | 5/2004 | Allen, Jr. et al. |
| 2004/0128563 A1 | 7/2004 | Kaushik et al. |
| 2004/0130466 A1* | 7/2004 | Lu ................................. 341/50 |
| 2004/0140459 A1 | 7/2004 | Haigh et al. |
| 2004/0153952 A1 | 8/2004 | Sharma et al. |
| 2004/0176065 A1 | 9/2004 | Liu |
| 2004/0184450 A1 | 9/2004 | Omran |
| 2004/0199652 A1 | 10/2004 | Zou et al. |
| 2004/0221315 A1 | 11/2004 | Kobayashi |
| 2004/0260823 A1 | 12/2004 | Tiwari et al. |
| 2005/0012905 A1 | 1/2005 | Morinaga |
| 2005/0020279 A1 | 1/2005 | Markhovsky et al. |
| 2005/0021885 A1 | 1/2005 | Anderson et al. |
| 2005/0033586 A1 | 2/2005 | Savell |
| 2005/0055399 A1 | 3/2005 | Savchuk |
| 2005/0088939 A1 | 4/2005 | Hwang et al. |
| 2005/0091593 A1 | 4/2005 | Peltz |
| 2005/0108611 A1 | 5/2005 | Vogt et al. |
| 2005/0117601 A1 | 6/2005 | Anderson et al. |
| 2005/0120079 A1 | 6/2005 | Anderson et al. |
| 2005/0120208 A1 | 6/2005 | Dobson et al. |
| 2005/0125840 A1 | 6/2005 | Anderson et al. |
| 2005/0135390 A1 | 6/2005 | Anderson et al. |
| 2005/0138260 A1 | 6/2005 | Love et al. |
| 2005/0144225 A1 | 6/2005 | Anderson et al. |
| 2005/0154599 A1 | 7/2005 | Kopra et al. |
| 2005/0163085 A1 | 7/2005 | Cromer et al. |
| 2005/0163116 A1 | 7/2005 | Anderson et al. |
| 2005/0165970 A1 | 7/2005 | Ching et al. |
| 2005/0184993 A1 | 8/2005 | Ludwin et al. |
| 2005/0204057 A1 | 9/2005 | Anderson et al. |
| 2005/0213593 A1 | 9/2005 | Anderson et al. |
| 2005/0216421 A1 | 9/2005 | Barry et al. |
| 2005/0216599 A1 | 9/2005 | Anderson et al. |
| 2005/0216623 A1 | 9/2005 | Dietrich et al. |
| 2005/0248685 A1 | 11/2005 | Seo et al. |
| 2005/0259670 A1 | 11/2005 | Anderson et al. |
| 2005/0265333 A1 | 12/2005 | Coffey et al. |
| 2005/0271072 A1 | 12/2005 | Anderson et al. |
| 2005/0286466 A1 | 12/2005 | Tagg et al. |
| 2006/0004968 A1 | 1/2006 | Vogt et al. |
| 2006/0034301 A1 | 2/2006 | Anderson et al. |
| 2006/0034326 A1 | 2/2006 | Anderson et al. |
| 2006/0120433 A1 | 6/2006 | Baker et al. |
| 2006/0128399 A1 | 6/2006 | Duan et al. |
| 2006/0161691 A1 | 7/2006 | Katibian et al. |
| 2006/0164424 A1 | 7/2006 | Wiley et al. |
| 2006/0168496 A1 | 7/2006 | Steele et al. |
| 2006/0171414 A1 | 8/2006 | Katibian et al. |
| 2006/0179164 A1 | 8/2006 | Katibian et al. |
| 2006/0179384 A1 | 8/2006 | Wiley et al. |
| 2006/0212775 A1 | 9/2006 | Cypher et al. |
| 2006/0274031 A1 | 12/2006 | Yuen et al. |
| 2006/0288133 A1 | 12/2006 | Katibian et al. |
| 2007/0008897 A1 | 1/2007 | Denton et al. |
| 2007/0073949 A1 | 3/2007 | Fredrickson et al. |
| 2007/0098002 A1 | 5/2007 | Liu et al. |
| 2007/0274434 A1* | 11/2007 | Arkas et al. .................... 377/94 |
| 2008/0036631 A1 | 2/2008 | Musfeldt |
| 2008/0129749 A1 | 6/2008 | Wiley et al. |
| 2008/0147951 A1 | 6/2008 | Love |
| 2008/0282296 A1 | 11/2008 | Kawai et al. |
| 2009/0055709 A1 | 2/2009 | Anderson et al. |
| 2009/0070479 A1 | 3/2009 | Anderson et al. |
| 2009/0290628 A1 | 11/2009 | Matsumoto |
| 2010/0128626 A1 | 5/2010 | Anderson et al. |
| 2010/0260055 A1 | 10/2010 | Anderson et al. |
| 2011/0013681 A1 | 1/2011 | Zou et al. |
| 2011/0022719 A1 | 1/2011 | Anderson et al. |
| 2011/0199383 A1 | 8/2011 | Anderson et al. |
| 2011/0199931 A1 | 8/2011 | Anderson et al. |
| 2012/0008642 A1 | 1/2012 | Katibian et al. |

FOREIGN PATENT DOCUMENTS

| | | |
|---|---|---|
| CN | 1310400 A | 8/2001 |
| CN | 1377194 A | 10/2002 |
| CN | 1467953 A | 1/2004 |
| CN | 1476268 A | 2/2004 |
| EP | 0594006 | 4/1994 |
| EP | 0872085 | 12/1996 |
| EP | 0850522 A2 | 7/1998 |
| EP | 0896318 | 2/1999 |
| EP | 0969676 | 1/2000 |
| EP | 1217602 A2 | 6/2002 |
| EP | 1309151 | 5/2003 |
| EP | 1423778 A2 | 6/2004 |
| EP | 1478137 A1 | 11/2004 |
| EP | 1544743 A2 | 6/2005 |
| EP | 1580964 A1 | 9/2005 |
| EP | 1630784 | 3/2006 |
| FR | 2729528 A1 | 7/1996 |
| GB | 2250668 A | 6/1992 |
| GB | 2265796 | 10/1993 |
| JP | 53131709 A | 11/1978 |
| JP | 62132433 A | 6/1987 |
| JP | 64-008731 | 1/1989 |
| JP | H01129371 A | 5/1989 |
| JP | 1314022 A | 12/1989 |
| JP | H0465711 A | 3/1992 |
| JP | 4167715 A | 6/1992 |
| JP | H04181823 A | 6/1992 |
| JP | 4241541 | 8/1992 |
| JP | 5199387 A | 8/1993 |
| JP | 5219141 A | 8/1993 |
| JP | 5260115 A | 10/1993 |
| JP | 6037848 A | 2/1994 |
| JP | 06053973 | 2/1994 |
| JP | 06317829 | 11/1994 |
| JP | 7115352 A | 5/1995 |
| JP | 837490 | 2/1996 |
| JP | H0854481 A | 2/1996 |
| JP | 08-274799 | 10/1996 |
| JP | 09-006725 | 1/1997 |
| JP | H0923243 A | 1/1997 |
| JP | 09230837 | 9/1997 |
| JP | 09-270951 | 10/1997 |
| JP | 09261232 | 10/1997 |
| JP | 9307457 A | 11/1997 |
| JP | 10-234038 | 2/1998 |
| JP | 10200941 | 7/1998 |
| JP | 10312370 | 11/1998 |
| JP | 1117710 | 1/1999 |
| JP | 11032041 | 2/1999 |
| JP | 11122234 A | 4/1999 |
| JP | 11163690 A | 6/1999 |
| JP | 11225182 A | 8/1999 |
| JP | 11225372 A | 8/1999 |
| JP | 11249987 A | 9/1999 |
| JP | 11282786 A | 10/1999 |
| JP | 11341363 A | 12/1999 |
| JP | 11355327 A | 12/1999 |
| JP | 2000183840 A | 6/2000 |
| JP | 2000188626 | 7/2000 |
| JP | 2000216843 A | 8/2000 |
| JP | 2000236260 A | 8/2000 |
| JP | 2000278141 A | 10/2000 |
| JP | 2000295667 | 10/2000 |
| JP | 2000324135 A | 11/2000 |
| JP | 2000358033 A | 12/2000 |

(56) References Cited

FOREIGN PATENT DOCUMENTS

| | | |
|---|---|---|
| JP | 200144960 | 2/2001 |
| JP | 200194542 | 4/2001 |
| JP | 2001094524 | 4/2001 |
| JP | 2001177746 | 6/2001 |
| JP | 2001222474 A | 8/2001 |
| JP | 2001-282714 | 10/2001 |
| JP | 2001292146 A | 10/2001 |
| JP | 2001306428 | 11/2001 |
| JP | 2001319745 A | 11/2001 |
| JP | 2001320280 A | 11/2001 |
| JP | 2001333130 A | 11/2001 |
| JP | 2002-503065 | 1/2002 |
| JP | 2002500855 A | 1/2002 |
| JP | 2002062990 A | 2/2002 |
| JP | 2002208844 A | 7/2002 |
| JP | 2002281007 A | 9/2002 |
| JP | 2002-300229 | 10/2002 |
| JP | 2002300229 A | 10/2002 |
| JP | 20039035 | 1/2003 |
| JP | 2003006143 A | 1/2003 |
| JP | 2003044184 A | 2/2003 |
| JP | 2003046595 | 2/2003 |
| JP | 2003046596 A | 2/2003 |
| JP | 2003058271 A | 2/2003 |
| JP | 2003069544 A | 3/2003 |
| JP | 2003076654 | 3/2003 |
| JP | 2003-098583 | 4/2003 |
| JP | 2003111135 | 4/2003 |
| JP | 2003167680 | 6/2003 |
| JP | 2003198550 | 7/2003 |
| JP | 2003303068 A | 10/2003 |
| JP | 2004005683 A | 1/2004 |
| JP | 2004007356 | 1/2004 |
| JP | 2004021613 | 1/2004 |
| JP | 200446324 | 2/2004 |
| JP | 2004153620 | 5/2004 |
| JP | 2004242294 A | 8/2004 |
| JP | 2004246023 A | 9/2004 |
| JP | 2004297660 A | 10/2004 |
| JP | 2004531916 T | 10/2004 |
| JP | 2004309623 A | 11/2004 |
| JP | 2004363687 A | 12/2004 |
| JP | 2005107683 A | 4/2005 |
| JP | 2005536167 A | 11/2005 |
| JP | 2005539464 A | 12/2005 |
| JP | 2008522493 | 6/2008 |
| KR | 1999-61245 | 7/1999 |
| KR | 0222225 | 10/1999 |
| KR | 1019990082741 | 11/1999 |
| KR | 200039224 | 7/2000 |
| KR | 1999-0058829 | 1/2001 |
| KR | 20010019734 | 3/2001 |
| KR | 20020071226 | 9/2002 |
| KR | 2003-0061001 | 7/2003 |
| KR | 102004-7003852 | 5/2004 |
| KR | 2004-69360 | 8/2004 |
| KR | 102006-0053050 | 5/2006 |
| KR | 102006-0056989 | 5/2006 |
| KR | 2004-0014406 | 2/2007 |
| RU | 2111619 | 5/1998 |
| RU | 2150791 | 6/2000 |
| RU | 2337497 | 10/2008 |
| RU | 2337497 C2 | 10/2008 |
| TW | 459184 B | 10/2001 |
| TW | 466410 | 12/2001 |
| TW | 488133 B | 5/2002 |
| TW | 507195 | 10/2002 |
| TW | 513636 | 12/2002 |
| TW | 515154 | 12/2002 |
| TW | 529253 | 4/2003 |
| TW | 535372 | 6/2003 |
| TW | 540238 B | 7/2003 |
| TW | 542979 B | 7/2003 |
| TW | 200302008 | 7/2003 |
| TW | 546958 | 8/2003 |
| TW | 552792 B | 9/2003 |
| TW | 200304313 | 9/2003 |
| TW | 563305 B | 11/2003 |
| TW | 569547 B | 1/2004 |
| TW | 595116 B | 6/2004 |
| WO | 9210890 | 6/1992 |
| WO | 92010890 | 6/1992 |
| WO | 9410779 | 5/1994 |
| WO | 9619053 | 6/1996 |
| WO | 96/42158 | 12/1996 |
| WO | 98/02988 | 1/1998 |
| WO | WO9915979 | 4/1999 |
| WO | 9923783 A2 | 5/1999 |
| WO | 0130038 | 4/2001 |
| WO | 0138970 | 5/2001 |
| WO | WO0137484 A2 | 5/2001 |
| WO | WO0138982 | 5/2001 |
| WO | WO0158162 | 8/2001 |
| WO | 0249314 | 6/2002 |
| WO | WO02098112 | 12/2002 |
| WO | 03023587 | 3/2003 |
| WO | WO03023587 | 3/2003 |
| WO | 03039081 | 5/2003 |
| WO | 03040893 | 5/2003 |
| WO | 03061240 | 7/2003 |
| WO | WO2004015680 | 2/2004 |
| WO | 2004110021 | 12/2004 |
| WO | 2005018191 | 2/2005 |
| WO | 2005073955 A1 | 8/2005 |
| WO | 2005088939 | 9/2005 |
| WO | 2005091593 | 9/2005 |
| WO | 2005096594 | 10/2005 |
| WO | 2005122509 | 12/2005 |
| WO | 2006/058045 | 6/2006 |
| WO | 2006/058050 | 6/2006 |
| WO | 2006/058051 | 6/2006 |
| WO | 2006/058052 | 6/2006 |
| WO | 2006/058053 | 6/2006 |
| WO | 2006/058067 | 6/2006 |
| WO | 2006058173 | 6/2006 |
| WO | WO2006058045 A2 | 6/2006 |
| WO | WO2006058051 | 6/2006 |
| WO | WO2007051186 | 5/2007 |

OTHER PUBLICATIONS

Plug and Display Standard, Video Electronics Association (VESA) San Jose, CA (Jun. 11, 2997). cited by other.
International Search Report issued to PCT/US05/042643.
International Search Report issued to PCT/US05/042402.
International Search Report issued to PCT/US05/042414.
International Search Report issued to PCT/US05/042436.
International Search Report issued to PCT/US05/042415.
International Search Report issued to PCT/US07/075127.
International Search Report issued to PCT/US05/008073.
International Search Report issued to PCT/US05/008832.
International Search Report issued to PCT/US2005/009944.
International Search Report issued to PCT/US2005/019530.
J. Sevanto, "Multimedia messaging service for GPRS and UMTS", IEEE on WCNC, Sep. 1999, pp. 1422-1426, vol. 3.
"V4400," Product Brochure May 31, 2004.
Written Opinion PCT/US05/042643 International Search Authority US, Oct. 5, 2006.
International Preliminary Report on Patentability PCT/US05/042402 IPEA/US Jun. 19, 2007.
Written Opinion PCT/US05/042402 PCT/US05/042402, International Search Authority US, Feb. 20, 2007.
International Preliminary Report on Patentability PCT/US05/042414, International Search Authority—European Patent Office Jun. 19, 2007.
Written Opinion PCT/US05/042414—International Search Authority, US May 23, 2007.
International Search Report PCT/US2005/042413, International Search Authority US, Aug. 25, 2008.
International Preliminary Report on Patentability PCT/US05/042413, International Search Authority US, Aug. 25, 2008.

(56) References Cited

OTHER PUBLICATIONS

Written Opinion PCT/US05/042413 International Search Authority US, Aug. 25, 2008.
International Preliminary Report on Patentability PCT/US05/042415, International Search Authority US, Apr. 10, 2007.
Written Opinion PCT/US05/042415, International Search Authority US, Nov. 8, 2006.
"Transmission and Multiplexing; High Bit Rate Digital Subscriber Line (HDSL) Transmission System on Metallic Local Lines; HDSL Core Specification and Applications for 2 048 Kbit/S Based Access Digital Sections; ETR 152" European Telecommunications Standard (Dec. 1996)).
IEEE STD 1394B;IEEE Standard for High Performance Serial Bus-Amendment 2(Dec. 2002).
VESA Mobile Display Digital Interface, Proposed Standard: Version 1P, Draft 10, Aug. 13, 2003, pp. 1-75.
VESA Mobile Display Digital Interface, Proposed Standard: Version 1 p, Draft 1 0, Aug. 13, 2003, pp. 76-151.
VESA Mobile Display Digital Interface, Proposed Standard: Version 1 p, Draft 11, Sep. 10, 2003, pp. 1-75.
VESA Mobile Display Digital Interface, Proposed Standard: Version 1 P, Draft 11, Sep. 10, 2003, pp. 76-150.
VESA Mobile Display Digital Interface, Proposed Standard: Version 1P, Draft 13, Oct. 15, 2003, pp. 1-75.
VESA Mobile Display Digital Interface, Proposed Standard: Version 1P, Draft 13, Oct. 15, 2003, pp. 76-154.
VESA Mobile Display Digital Interface, Proposed Standard: Version1P, Draft 14, Oct. 29, 2003, pp. 1-75.
VESA Mobile Display Digital Interface, Proposed Standard: Version 1P, Draft 14, Oct. 29, 2003, pp. 76-158.
VESA Mobile Display Digital Interface, Proposed Standard: Version 1P, Draft 15, Nov. 12, 2003, pp. 1-75.
VESA Mobile Display Digital Interface, Proposed Standard: Version 1P, Draft 15, Nov. 12, 2003, pp. 76-160.
Liptak, "Instrument Engineer's Handbook, Third Edition, vol. Three: Process Software and Digital Networks, Section 4.17, Proprietary Networks, pp. 627-637, Boca Raton" CRC Press, Jun. 26, 2002.
European Search Report—EP10172872, Search Authority—Munich Patent Office, Dec. 17, 2010.
European Search Report—EP10172878, Search Authority—Munich Patent Office, Dec. 17, 2010.
European Search Report—EP10172882, Search Authority—Munich Patent Office, Dec. 29, 2010.
European Search Report—EP10172885, Search Authority—Munich Patent Office, Dec. 23, 2010.
Hopkins, K. et al.: "Display Power Management," IP.com Journal; IP.com Inc., West Henrietta, NY (Mar. 1, 1995), XP013103130, ISSN: 1533-0001, vol. 38 No. 3 pp. 425-427.
Masnick, B. et al., "On Linear Unequal Error Protection Codes" IEEE Transactions on Information Theory, vol. IT-3, No. 4, Oct. 1967, pp. 600-607.
"Universal Serial Bus Specification—Revision 2.0: Chapter 9—USB Device Framework," Universal Serial Bus Specification, Apr. 27, 2000, pp. 239-274, XP002474828.
VESA: VESA Mobile Display Digital Interface Standard: Version 1. Milpitas, CA (Jul. 23, 2004), pp. 87-171.
STMicroelectronics: "STV0974 Mobile Imaging DSP Rev.3", Datasheet internet, (Nov. 30, 2004), XP002619368. Retrieved from the Internet: URL: http://pdf1.alldatasheet.com/datasheet-pdf/view/112376/STMICROELECTRONICS/STV0974.html [retrieved on Jan. 27, 2011], pp. 1-69.
Supplementary European Search Report—EP05852044—Search Authority—The Hague—May 17, 2011.
Taiwan Search Report—TW093127510—TIPO—Apr. 1, 2011.
Taiwan Search Report—TW093133101—TIPO—Mar. 28, 2011.
Translation of Office Action in Chinese application 201010183254.3 corresponding to U.S. Appl. No. 11/008,024, dated Apr. 21, 2011.
http://www.3gpp2.org/public_html/specs/C.S0047-0_v1.0_110403.pdf, 3rd Generation Patnership Project 2, Date Apr. 14, 2003, pp. 1-36.
Supplementary European Search Report—EP05852049—Search Authority—The Hague—Aug. 17, 2011.
"Nokia 6255", Retrieved from the Internet: URL: http://nokiamuseum.com/view.php"model=6255 [retrieved on Feb. 4, 2012], 2 pgs.
Taiwan Search Report—TW094141286—TIPO—Aug. 7, 2012.

\* cited by examiner

Mux output for particular counter input selection value

| Input | $S_2S_1S_0$ |
|---|---|
| D0 | 001 |
| D1 | 011 |
| D2 | 010 |
| D3 | 110 |
| D4 | 111 |
| D5 | 101 |
| D6 | 100 |
| D7 | 000 |

FIG.7

DOUBLE DATA RATE SERIAL ENCODER

BACKGROUND

1. Field

The present invention relates generally to a serial encoder for high data rate serial communication links. More particularly, the invention relates to a double data rate serial encoder for Mobile Display Digital Interface (MDDI) links.

2. Background

In the field of interconnect technologies, demand for ever increasing data rates, especially as related to video presentations, continues to grow.

The Mobile Display Digital Interface (MDDI) is a cost-effective, low power consumption, transfer mechanism that enables very-high-speed data transfer over a short-range communication link between a host and a client. MDDI requires a minimum of just four wires plus power for bi-directional data transfer that delivers a maximum bandwidth of up to 3.2 Gbits per second.

In one application, MDDI increases reliability and decreases power consumption in clamshell phones by significantly reducing the number of wires that run across a handset's hinge to interconnect the digital baseband controller with an LCD display and/or a camera. This reduction of wires also allows handset manufacturers to lower development costs by simplifying clamshell or sliding handset designs.

MDDI is a serial transfer protocol, and, as such, data received in parallel for transmission over an MDDI link needs to be serialized. What is needed therefore is a serial encoder, integrable in an MDDI link controller, that supports the high-speed data rate of MDDI.

SUMMARY

In one aspect of the present invention, a double data rate serial encoder for MDDI is provided. The serial encoder comprises a multiplexer (mux) having a plurality of inputs, a plurality of latches coupled to the inputs of the mux, an enabler to enable the latches to update their data inputs, and a counter to select one of the plurality of inputs of the mux for output.

In another aspect of the invention, the mux provides a glitch-less output during input transitions. The mux may include an output selection algorithm optimized based on a priori knowledge of an input selection sequence provided by the counter. The input selection sequence may be Gray code sequence.

Further embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

FIG. 7 illustrates a mux output selection algorithm in response to a Gray code input selection sequence.

The present invention will be described with reference to the accompanying drawings. The drawing in which an element first appears is typically indicated by the leftmost digit(s) in the corresponding reference number.

DETAILED DESCRIPTION

Figure 1:
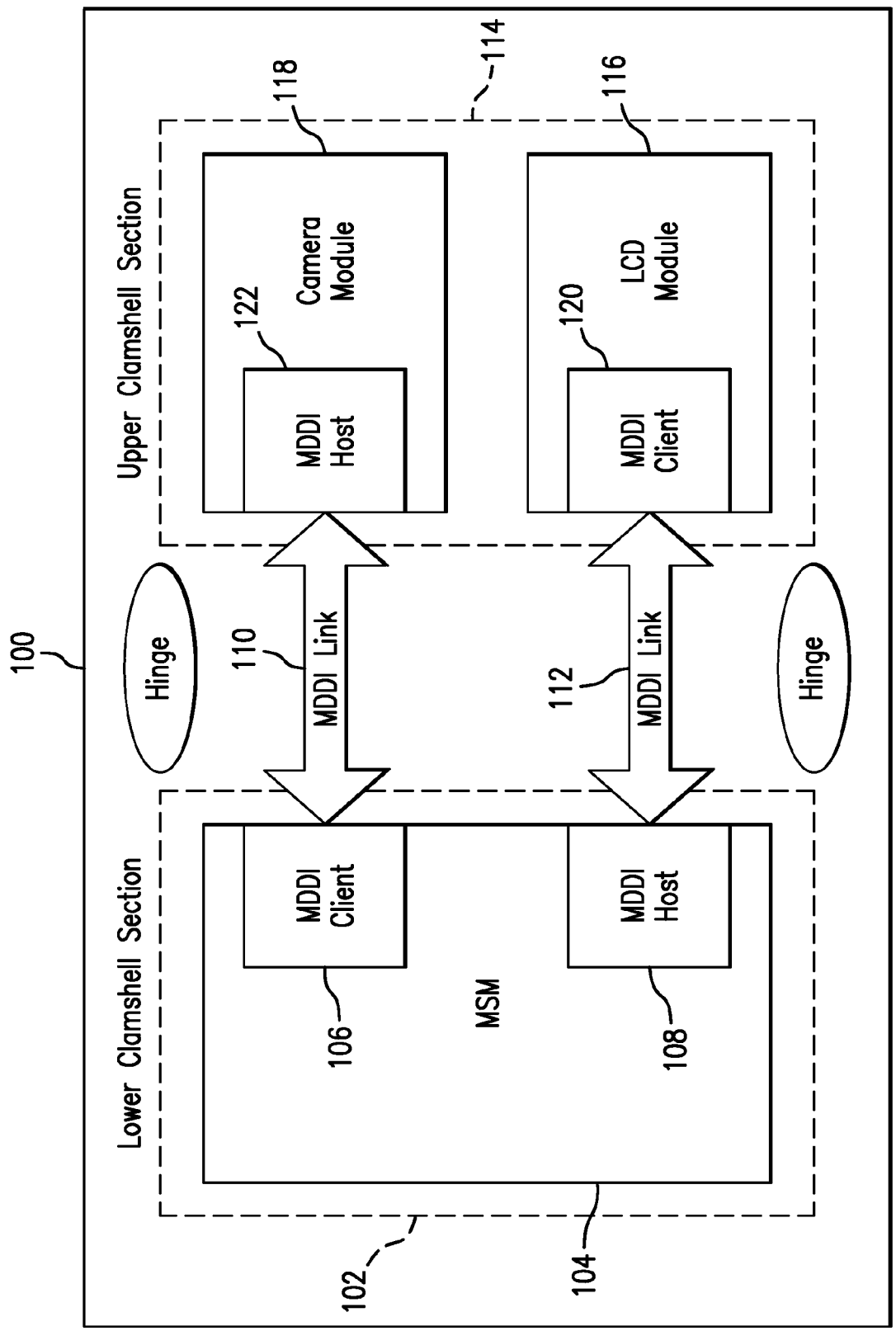
FIG. 1 is a block diagram that illustrates an example environment using a Mobile Display Digital Interface (MDDI) interface.
Figure 1A:
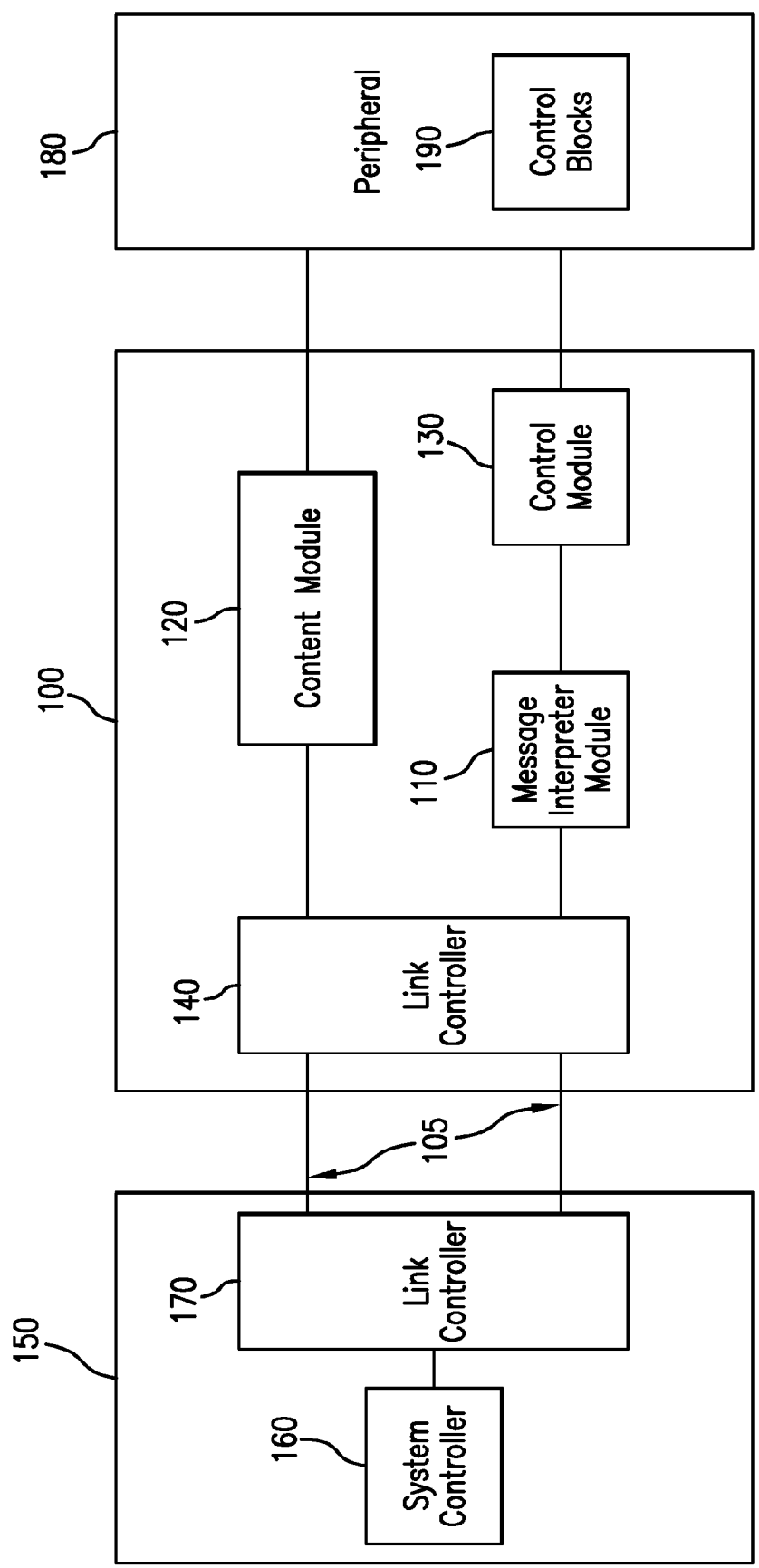
FIG. 1A is a diagram of a digital data device interface coupled to a digital device and a peripheral device

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Mobile Display Digital Interface (MDDI)

The Mobile Display Digital Interface (MDDI) is a cost-effective, low power consumption, transfer mechanism that enables very-high-speed serial data transfer over a short-range communication link between a host and a client.

In the following, examples of MDDI will be presented with respect to a camera module contained in an upper clamshell of a mobile phone. However, it would be apparent to persons skilled in the relevant art(s) that any module having functionally equivalent features to the camera module could be readily substituted and used in embodiments of this invention.

Further, according to embodiments of the invention, an MDDI host may comprise one of several types of devices that can benefit from using the present invention. For example, the host could be a portable computer in the form of a handheld, laptop, or similar mobile computing device. It could also be a Personal Data Assistant (PDA), a paging device, or one of many wireless telephones or modems. Alternatively, the host could be a portable entertainment or presentation device such as a portable DVD or CD player, or a game playing device. Furthermore, the host can reside as a host device or control element in a variety of other widely used or planned commercial products for which a high speed communication link is desired with a client. For example, a host could be used to transfer data at high rates from a video recording device to a storage based client for improved response, or to a high resolution larger screen for presentations. An appliance such as a refrigerator that incorporates an onboard inventory or computing system and/or Bluetooth connections to other household devices, can have improved display capabilities when operating in an internet or Bluetooth connected mode, or have reduced wiring needs for in-the-door displays (a client) and keypads or scanners (client) while the electronic computer or control systems (host) reside elsewhere in the cabinet. In general, those skilled in the art will appreciate the wide variety of modern electronic devices and appliances that may benefit from the use of this interface, as well as the ability to retrofit older devices with higher data rate transport of information utilizing limited numbers of conductors available in either newly added or existing connectors or cables. At the same time, an MDDI client may comprise a variety of devices useful for presenting information to an end user, or presenting information from a user to the host. For example, a microdisplay incorporated in goggles or glasses, a projection device built into a hat or helmet, a small screen or even holographic element built into a vehicle, such as in a window or windshield, or various speaker, headphone, or sound systems for presenting high quality sound or music. Other presentation devices include projectors or projection devices used to present information for meetings, or for movies and television images. Another example would be the use of touch pads or sensitive devices, voice recognition input devices, security scanners, and so forth that may be called upon to transfer a significant amount of information from a device or system user with little actual "input" other than touch or sound from the user. In addition, docking stations for computers and car kits or desk-top kits and holders for wireless telephones may act as interface devices to end users or to other devices and equipment, and employ either clients (output or input devices such as mice) or hosts to assist in the transfer of data, especially where high speed networks are involved. However, those skilled in the art will readily recognize that the present invention is not limited to these devices, there being many other devices on the market, and proposed for use, that are intended to provide end users with high quality images and sound, either in terms of storage and transport or in terms of presentation at playback. The present invention is useful in increasing the data throughput between various elements or devices to accommodate the high data rates needed for realizing the desired user experience.

FIG. 1 is a block diagram that illustrates an example environment using an MDDI interface. In the example of FIG. 1, MDDI is used to interconnect modules across the hinge of a clamshell phone 100. It must be noted here that while certain embodiments of the present invention will be, described in the context of specific examples, such as MDDI interconnections in a clamshell phone, this is done for illustration purposes only and should not be used to limit the present invention to such embodiments. As will be understood by a person skilled in the relevant art(s) based on the teachings herein, embodiments of the present invention may be used in other devices including any that may benefit from having MDDI interconnections.

Referring to FIG. 1, a lower clamshell section 102 of clamshell phone 100 includes a Mobile Station Modem (MSM) baseband chip 104. MSM 104 is a digital baseband controller. An upper clamshell section 114 of clamshell phone 100 includes a Liquid Crystal Display (LCD) module 116 and a camera module 118.

Still referring to FIG. 1, an MDDI link 110 connects camera module 118 to MSM 104. Typically, an MDDI link controller is integrated into each of camera module 118 and MSM 104. In the example of FIG. 1, an MDDI Host 122 is integrated into camera module 112, while an MDDI Client 106 resides on the MSM side of the MDDI link 110. Typically, the MDDI host is the master controller of the MDDI link. In the example of FIG. 1, pixel data from camera module 118 are received and formatted into MDDI packets by MDDI Host 122 before being transmitted onto MDDI link 110. MDDI client 106 receives the MDDI packets and re-converts them into pixel data of the same format as generated by camera module 118. The pixel data are then sent to an appropriate block in MSM 104 for processing.

Still referring to FIG. 1, an MDDI link 112 connects LCD module 116 to MSM 104. In the example of FIG. 1, MDDI link 112 interconnects an MDDI Host 108, integrated into MSM 104, and an MDDI Client 120 integrated into LCD module 116. In the example of FIG. 1, display data generated by a graphics controller of MSM 104 are received and formatted into MDDI packets by MDDI Host 108 before being transmitted onto MDDI link 112. MDDI client 120 receives the MDDI packets and re-converts them into display data for use by LCD module 116.

Figure 2:
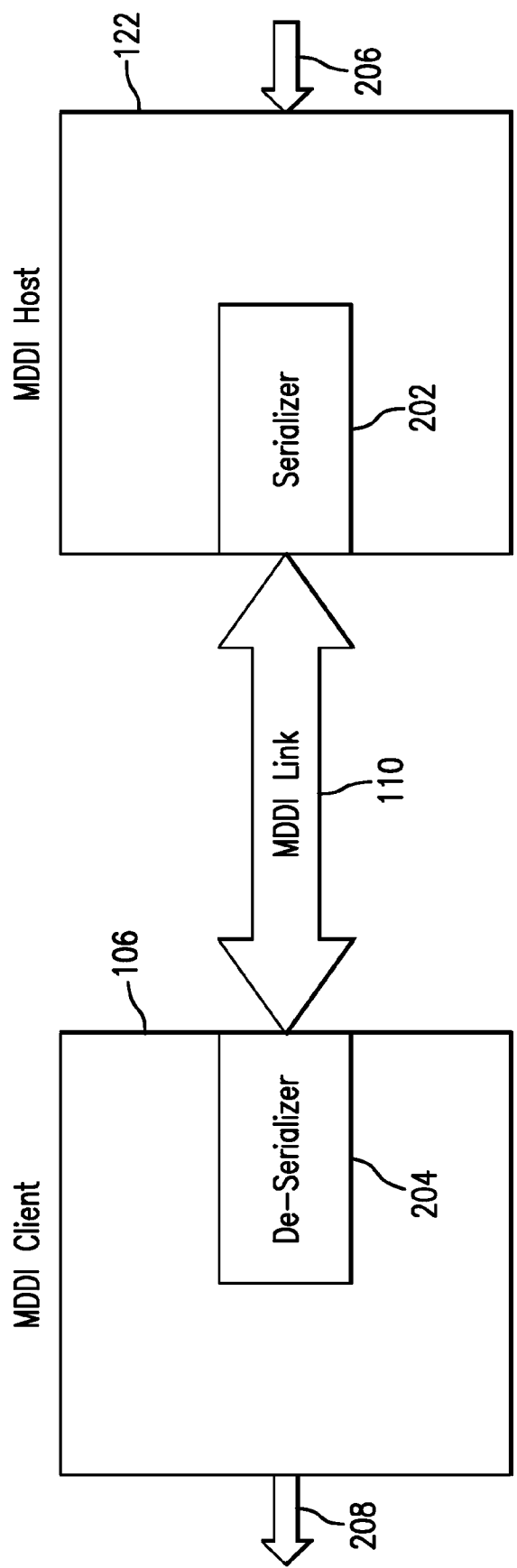
FIG. 2 is a block diagram that illustrates an MDDI link interconnection according to an embodiment of the example of FIG. 1.

FIG. 2 is a block diagram that illustrates MDDI link interconnection 110 according to the example of FIG. 1. As described above, one of the functions of MDDI link 110 is to transfer pixel data from camera module 118 to MSM 104. Accordingly, in the embodiment of FIG. 2, a frame interface 206 connects camera module 118 to MDDI Host 122. The frame interface 206 serves to transfer pixel data from camera module 118 to MDDI Host 122.

Typically, camera module 118 receives pixel data from a camera through a parallel interface, stores the pixel data, and then transfers it to MDDI Host 122 when the host is ready. MDDI Host 122 encapsulates the received pixel data into MDDI packets. However, in order for MDDI Host 122 be able to transmit the pixel data onto MDDI link 110, a serialization of the MDDI packets is necessary.

In the embodiment of FIG. 2, a serializer module 202, integrated within MDDI Host 122, serves to serially shift out the MDDI packets onto MDDI link 110. At the MSM end of MDDI link 110, a de-serializer module 204, integrated, within MDDI client 106, re-constructs the MDDI packets from the serial data received over MDDI link 110. MDDI client 106 then removes the MDDI encapsulation and transfers the parallel pixel data through a frame interface 208 to an appropriate block of MSM 104.

MDDI Host Core Architecture

The MDDI Host core provides a hardware implementation of the host side of the MDDI Specification as defined by the VESA (Video Electronics Standards Association). The MDDI Host core interfaces with both an MDDI Host processor and with an external connection operating as specified in the MDDI Specification.

Figure 3:
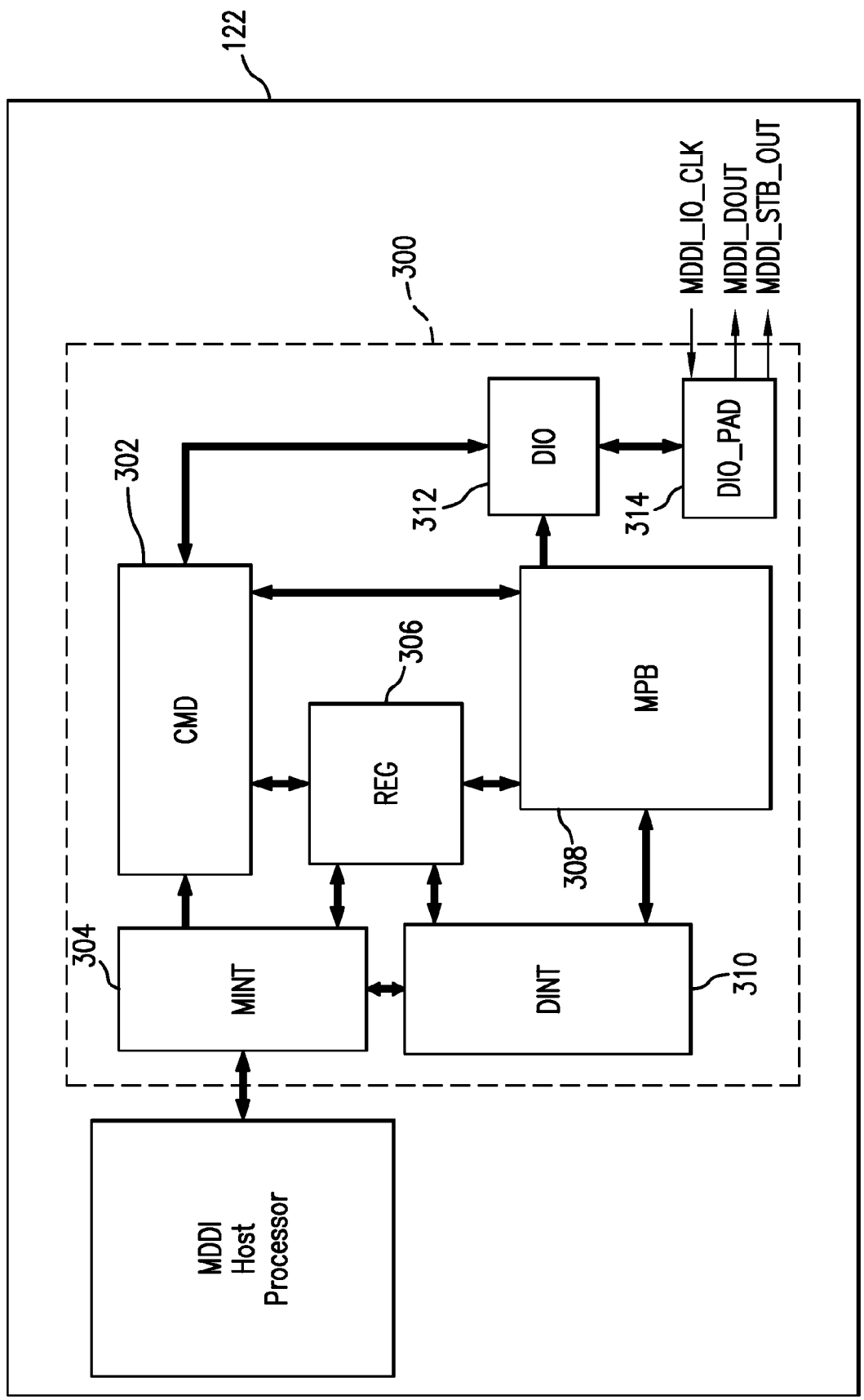
FIG. 3 is a block diagram that illustrates the internal architecture of the MDDI Host Core of the MDDI Host of FIG. 1.

FIG. 3 is a block diagram that illustrates the internal architecture of MDDI Host Core 300 of MDDI Host 122. MDDI Host Core 300 includes a Command Processor (CMD) block 302, a Microprocessor Interface (MINT) block 304, a Registers (REG) block 306, an MDDI Packet Builder (MPB) block 308, a Direct Access Memory (DMA) Interface (DINT) block 310, a Data Input/Output (DIO) block 312, and a DIO Pad block 314. The function of each block of MDDI, Host Core 300 will now be described with reference to FIG. 3.

CMD block 302 is responsible for processing commands issued by the MDDI Host 122 processor. Commands issued by the host processor include tasks such as powering up/down the MDDI link and generating certain MDDI packets.

MINT block 304 is responsible for interfacing with the MDDI Host processor. The MDDI Host processor uses MINT block 304 to set registers, read registers, and issue commands to MDDI Host core 300. MINT block 304 passes processor commands to CMD block 302 and register read/write commands to REG block 306.

REG block 306 stores various registers necessary for the transmission of data across the MDDI link. Registers of REG block 306 control the behavior of the MDDI link as well as the configuration of MDDI Host core 300.

MPB block 308 is responsible for creating the MDDI packets to be transmitted over the MDDI link as well as determining the order of transmission. MDDI packets are created from internal register values, and data retrieved by DINT block 310.

DINT block 310 is responsible for interfacing with a DMA bus of MDDI Host 122. DINT block 310 issues burst requests to an external SDRAM memory of MDDI Host 122 to buffer data for MPB block 308. In addition, DINT block 310 assists MPB block 308 in determining the order of packet transmissions on the MDDI link.

DIO block 312 is responsible for managing the physical MDDI link. DIO block 312 is responsible for Host-Client handshaking, data output, and round trip delay measurements. DIO block 312 receives data from MPB block 308 and passes it out to DIO Pad block 314 block to be shifted out.

DIO Pad block 314 receives parallel data from DIO block 312 and serially shifts it out onto the MDDI link. In essence, DIO Pad block 314 is responsible for the data serialization required for transmission on the MDDI link. As shown in FIG. 3, DIO Pad block 314 receives an MDDI Input/Output clock signal (MDDI_IO_CLK) from the MDDI Host, and outputs MDDI Data Out (MDDI_DOUT) and MDDI Strobe Out (MDDI_STB_OUT) signals. In one example, DIO Pad block 314 shifts data out at twice the MDDI Input/Output clock rate.

Figure 4:
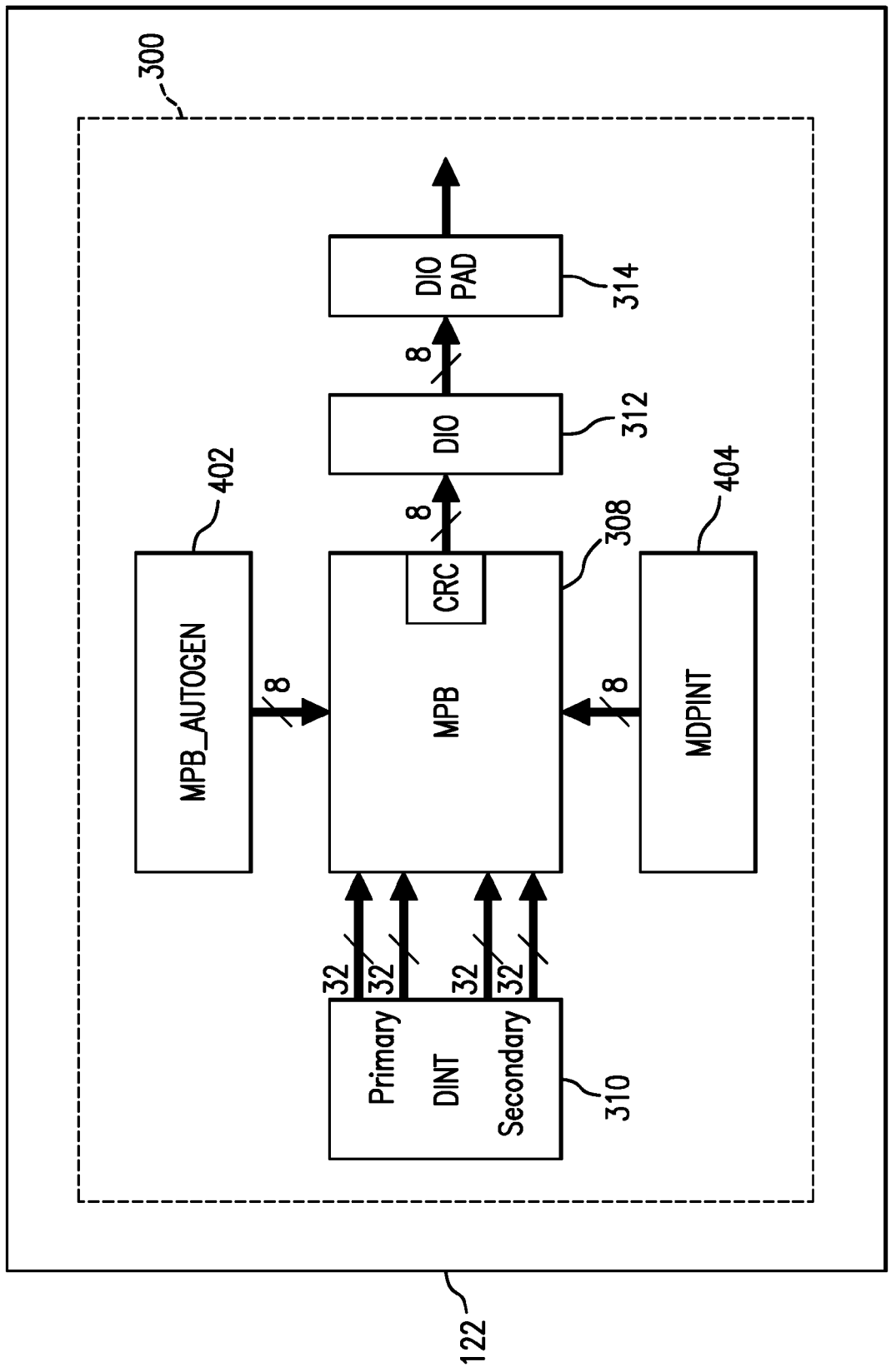
FIG. 4 is a block diagram that illustrates the data flow inside the MDDI Host Core of FIG. 3.

FIG. 4 is a block diagram that illustrates the data flow out of MDDI Host Core 300. For simplicity of illustration, certain blocks of MDDI Host Core 300 have been omitted.

Typically, at the MDDI link startup, the output data is entirely generated within DIO block 312 for Host-Client handshaking. Once the handshaking sequence is completed, MPB block 308 is allowed to direct the output flow of data which is received from three sources. An MPB_AUTOGEN block 402, a sub-block of the MPB block 308, generates packets internally within MPB block 308. Data from MPB_AUTOGEN block 402 is received on an 8-bit parallel bus. Such packets include, for example, filler packets, round trip delay measurements, and link shutdown packets.

DINT block 310 of MDDI Host core 300 routes to MPB block 308 packets received from an external SDRAM memory of MDDI Host 122. DINT block 310 uses four 32-bit parallel buses to route data to MPB block 308. An MDDI Data Packets (MDP) Interface (MDPINT) block 404, which is a sub-block of MPB block 308, interfaces with an MDP block outside of the MDDI Host core and typically receives video data packets for transmission. MDPINT block 404 interfaces with MPB block 308 using an 8-bit parallel bus.

MPB block 308 determines the order of transmission of packets received from DINT block 310, MPB_AUTOGEN block 402, and MDPINT block 404. MPB block 308 then directs data for transmission to DIO block 312 over an 8-bit parallel bus. In turn, DIO block 312 forwards the data, on an 8-bit parallel bus, to DIO Pad block 314. DIO Pad block 314 serializes the data received from DIO block 312 for transmission on the MDDI link. Embodiments of DIO Pad block 314 according to the present invention are further discussed below.

MDDI Serial Encoder

Figure 5:
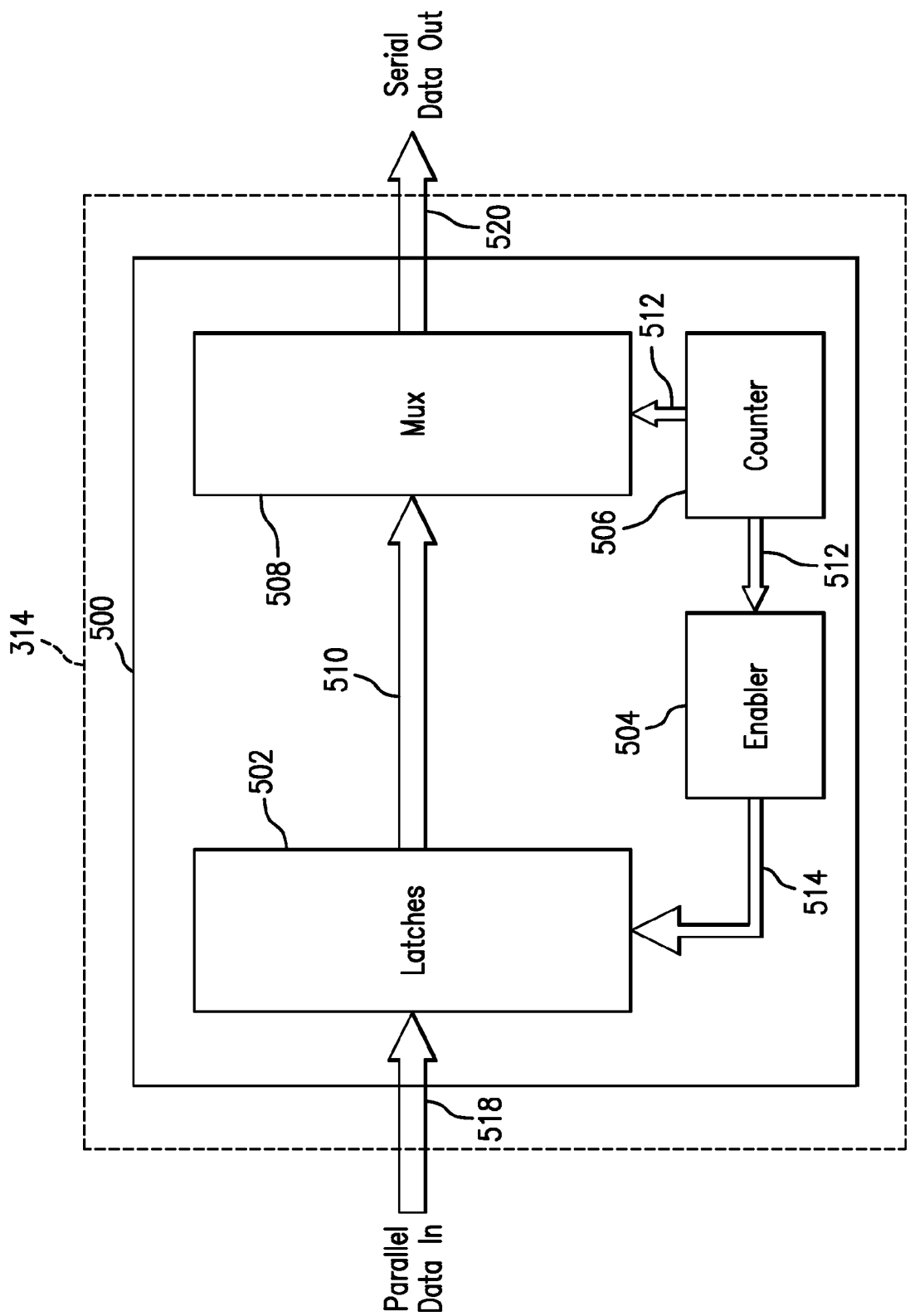
FIG. 5 is a block diagram that illustrates an MDDI serial encoder according to an embodiment of the present invention.

In essence, DIO Pad block 314 comprises a serial encoder for MDDI. FIG. 5 is a block diagram that illustrates an MDDI serial encoder 500 according to an embodiment of the present invention.

MDDI serial encoder 500 includes a block of latches 502, an enabler block 504, a counter block 506, and a mux 508. A parallel data interface provides a parallel data stream 518 to serial encoder 500. The parallel data stream is received and stored by latches 502. Counter 506 outputs an input selection sequence to control the output of mux 508. In the embodiment of FIG. 5, counter 506 provides mux 508 periodically with a set of select signals 512 to select the output of mux 508.

Using signals derived from the set of select signals 512, enabler 504 provides latches 502 with a set of signals 514 to enable them to update their data inputs. A set of signals 510 couple latches 502 to inputs of mux 508. Accordingly, the data inputs of latches 502 and the inputs of mux 508 are updated according to the input selection sequence generated by counter 506.

Mux 508 outputs a serial data stream 520 onto the MDDI link. In one example, mux 508 is an N:1 mux having N inputs and a single output, where N is an integer power of 2.

Figure 6:
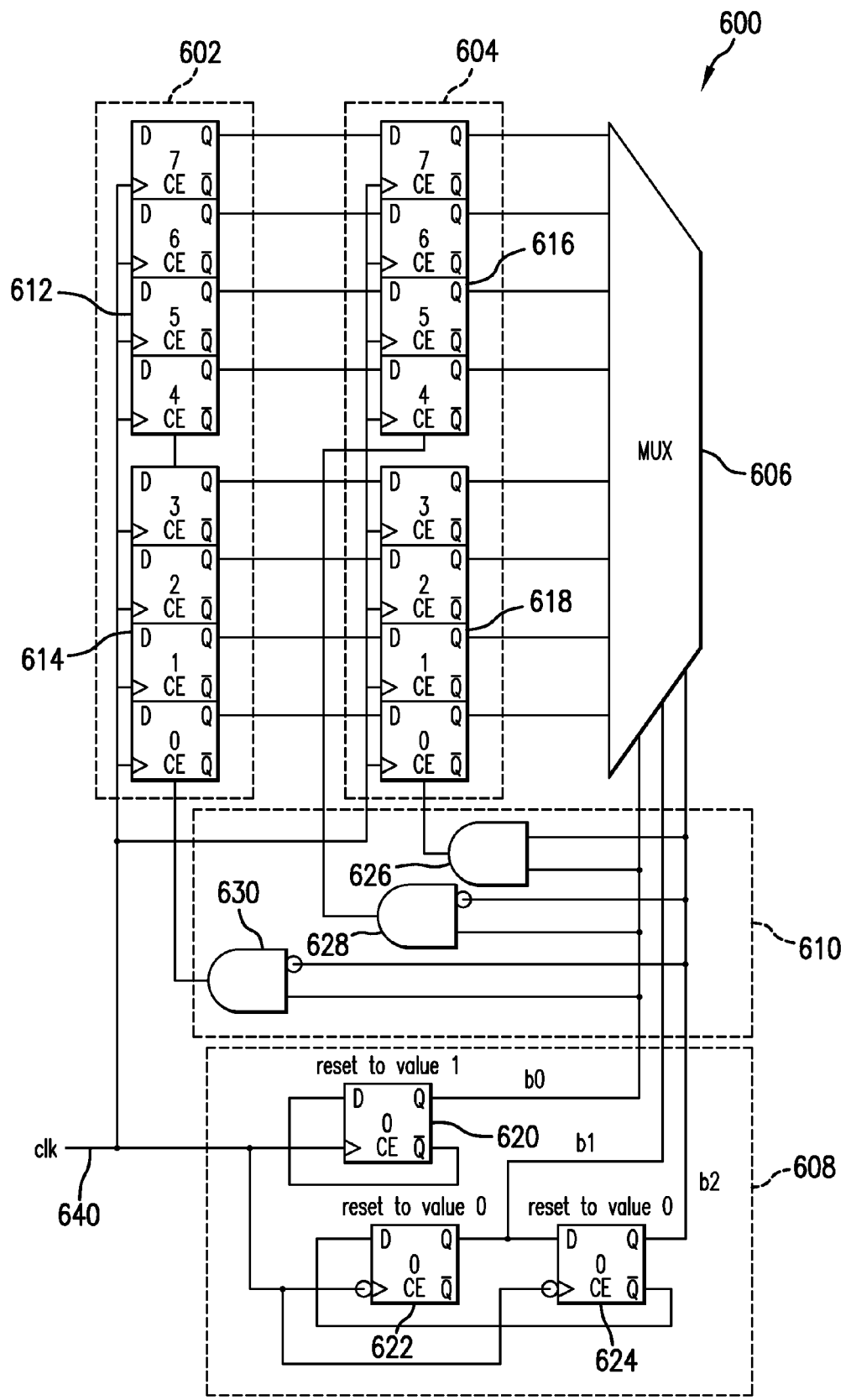
FIG. 6 is a circuit diagram that illustrates an MDDI serial encoder according to another embodiment of the present invention.

FIG. 6 is a circuit diagram that illustrates an MDDI serial encoder 600 according to another embodiment of the present invention. In the embodiment of FIG. 6, MDDI serial encoder 600 comprises a first layer of latches 602, a second layer of latches 604, a mux 606, a counter 608, and an enabler 610.

The first layer of latches 602 comprise first and second sets of latches 612 and 614. Similarly, the second layer of latches 604 comprise first and second sets of latches 616 and 618. First and second sets of latches 612 and 614 of the first layer of latches 602 are coupled, respectively, to first and second sets of latches 616 and 618 of the second layer of latches 604. Each set of latches 612, 614, 616, and 618 comprise a set of four D-latches. An input clock signal 640 is coupled to the clock input of each of the D-latches in the first and second layers of latches 602 and 604.

Mux 606 has a plurality of data inputs coupled to the outputs of the second layer of latches 604. Further, mux 606 comprises a set of select inputs being provided by counter 608. Typically, the mux has $2^N$ data inputs, where N is the number of select inputs. In the embodiment of FIG. 6, mux 606 has 8 data inputs and 3 select inputs b0, b1, and b2.

Counter 608 comprises a plurality of D-latches. In the embodiment of FIG. 6, counter 608 comprises a set of three D-latches 620, 622, and 624. Clock signal 640 provides an input to counter 608. The outputs of D-latches 620, 622, and 624 correspond, respectively, to select inputs b0, b1, and b2 of mux 606. Further, outputs of D-latches 620 and 624 are the inputs to enabler 610. Input clock signal 640 drives counter 608.

Enabler 610 comprises a plurality of AND gates. In the embodiment of FIG. 6, enabler 610 comprises three AND gates 626, 628, and 630. The inputs to AND gates 626, 628, and 630 are derived from the outputs of D-latches 620 and 624 of counter 608. The outputs of AND gates 626, 628, and 630 are coupled, respectively, to the second set of latches 618, the first set of latches 616, and the first and second sets of latches 612 and 614.

The operation of MDDI serial encoder 600 will now be described.

Assuming that serial encoder 600 has just been started, at the first rising edge of input clock signal 640, counter 608 outputs {b2, b1, b0}={0,0,1}. For this value of {b2, b1, b0}, the outputs of AND gates 628 and 630 of enabler 610 are true and, consequently, the inputs of the first and second sets of latches 612 and 614 of the first layer of latches 602 as well as the inputs of the first set of latches 616 of the second layer of latches 604 can be updated. Further, given that clock signal 640 is at a rising edge, the outputs of the first and second sets of latches 612 and 614 follow their corresponding inputs. Similarly, the outputs of the first set of latches 616 of the second layer of latches 604 also reflect their corresponding inputs. The inputs of the second set of latches 618 of the second layer of latches 604, however, remain unchanged. The mux 606 selects for output an input corresponding to the input selection value 001.

At the next falling edge of input clock signal 640, counter 608 outputs {b2, b1, b0}={0,1,1}. Given that {b2, b0}={0, 1}, the inputs of the first and second sets of latches 612 and 614 can be updated. However, since input clock, signal 640 is at a falling edge, the outputs of latches 612 and 614 will not yet reflect the updated inputs. In other words, the outputs of latches 612 and 614 will remain the same. Consequently, the inputs of latches 616 will also remain the same. Mux 606 selects for output an input corresponding to the input selection value 011.

At the next two rising and falling edges of input clock signal 640, counter 608 outputs {b2, b1, b0}={0,1,0} and {b2, b1, b0}={1,1,0}, respectively. No changes occur at the inputs or outputs of either set of latches.

At the next rising edge of input clock signal 640, counter 608 outputs {b2, b1, b0}={1,1,1}. For {b2,b0}={1,1 }), the output of AND gate 626 of enabler 610 is true and, consequently, the inputs of the second set of latches 618 of the second layer of latches 604 are updated. Further, given that input clock 640 is at a rising edge, the outputs of latches 618 follow their corresponding inputs. Mux 606 selects for output an input corresponding to the input selection value 011.

For the next three rising and falling clock edges, the counter transitions through the sequence {b2,b1,b0}={101, 100,000}. The inputs and outputs of all sets of latches 612, 614, 616, and 618 remain the same throughout these transitions. Subsequently, the input selection sequence returns to {b2,b1,b0}={0,0, 1} and the cycle described above restarts.

According to the description above of the operation of MDDI serial encoder 600, it is noted that counter 608 transitions on either a rising or a falling edge of input clock signal 640 and that mux 606 outputs one bit at every edge of input clock signal 640. Accordingly, MDDI serial encoder 600 is a double data rate encoder. Further, the input selection sequence {b2,b1,b0} has a single bit only changing at every counter transition. Accordingly, the input selection sequence outputted by counter 608 represents a Gray code sequence.

FIG. 7 illustrates a mux output sequence in response to the Gray code input selection sequence of the embodiment of FIG. 6. According to the mux output sequence of FIG. 7, it is noted that mux 606 sequentially selects for output the inputs coupled to the second set of latches 618 during the first half of the input selection sequence and the inputs coupled to the first set of latches 616 during the second half of the input selection sequence.

Meanwhile, enabler 610 enables for update the first set of latches 616 during the first half of the input selection sequence and the second set of latches 618 during the second half of the input selection sequence. Accordingly, the first and second sets of latches 616 and 618 are updated when they are not being selected for output by the mux 606.

Glitch-Free Output

Figure 8:
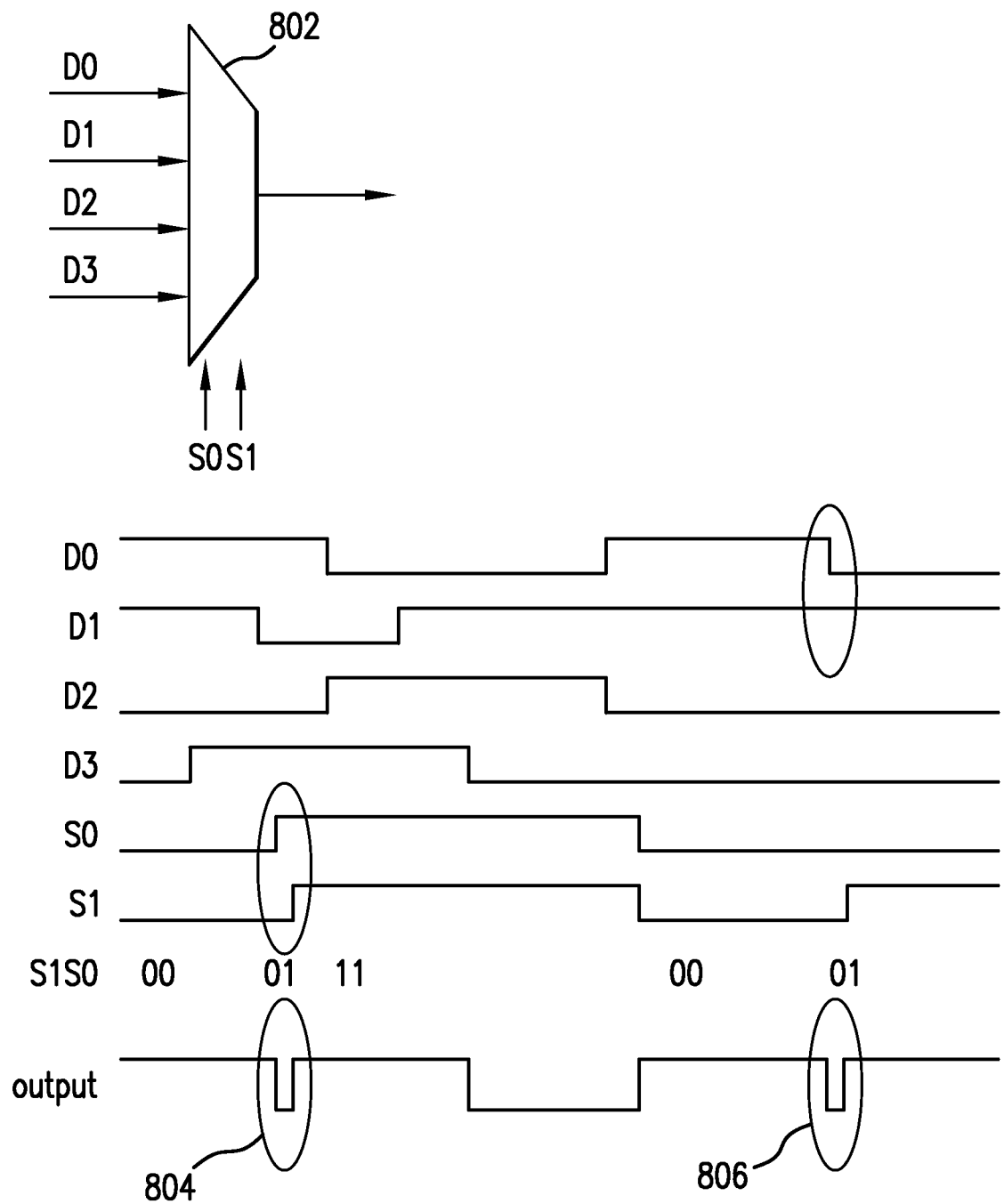
FIG. 8 is an example illustration of output glitches that can occur at the output of a mux due to select input transitions and data input transitions.

According to the present invention, mux 606 of MDDI serial encoder 600 provides a glitch-less output during input selection transitions. FIG. 8 is an example illustration of output glitches that can occur at the output of a mux due to transitions in the select inputs and/or the data inputs.

In the example of FIG. 8, a mux 802 has four data inputs D0, D1, D2, D3 and two select inputs S0 and S1. A first output glitch 804 is due to a transition in the select inputs of the mux. In the example, the input selection sequence {S1,S0} is transitioning from {0,0} to {1,1} in order to change the mux output from D0 to D3. However, due to a skew delay between the "0 to 1" transitions of S0 and S1, the input selection sequence {S1, S0} briefly takes the value {0,1} for which data input D1 is incorrectly selected. A "0" glitch appears at the output of mux 802 when the output should remain at "1" throughout the transition.

Typically, glitches of the type of glitch 804 may occur at the output of the mux whenever more than one select input changes values during an input selection transition. Accordingly, to prevent the occurrence of such glitches at the output of mux 606 of MDDI serial encoder 600, embodiments of the present invention employ a Gray code input selection sequence.

Another type of output glitch, illustrated as 806 in FIG. 8, occurs due to transitions in the data inputs of the mux. In the example of FIG. 8, in an input selection cycle, the input selection sequence {S1,S0} transitions from {0,0} to {0,1}. However, due a timing skew between the select signals S1, S0 and the data signal D0; the data signal D0 changes values before the end of its selection period. A "0" glitch appears at the output of mux 802 when the output should remain at "1" throughout the transition. To prevent such glitches at the output of mux 606 of MDDI serial encoder 600, embodiments of the present invention ensure that data inputs to the mux remain stable one clock cycle before being used. This is done by delay matching the paths from the select inputs to the output of mux.

In addition to the two types of mux output glitches illustrated in FIG. 8, yet another type of output glitch can occur at the output of a mux. This type of glitch, typically caused by a timing imbalance between internal signals within the mux itself, causes the mux to select no input during an input transition. As such, whenever the input transition is between data inputs both having the value "1", glitches of this type may be seen at the output of the mux. To prevent such glitches, the output of mux 606 of MDDI serial encoder 600 is designed such that it remains at "1" throughout any input transition between data inputs both having the value "1" at the time of the transition.

Optimized Output Selection Algorithm

The output of mux 606 of MDDI serial encoder 600 is governed by the following output selection algorithm:

| Mux output = | | |
|---|---|---|
| (sn(2) AND sn(1) AND sn(0) AND d(0)) | OR (sn(2) AND sn(1) AND s(0) AND d(1)) | OR |
| (sn(2) AND s(1) AND sn(0) AND d(2)) | OR (sn(2) AND s(1) AND s(0) AND d(3)) | OR |
| (s(2) AND sn(1) AND sn(0) AND d(4)) | OR (s(2) AND sn(1) AND s(0) AND d(5)) | OR |
| (s(2) AND s(1) AND sn(0) AND d(6)) | OR (s(2) AND s(1) AND s(0) AND d(7)) | OR |
| (sn(2) AND sn(1) AND d(1) AND d(0)) | OR (sn(1) AND sn(0) AND d(4) AND d(0)) | OR |
| (sn(2) AND s(0) AND d(3) AND d(1)) | OR (sn(2) AND s(1) AND d(3) AND d(2)) | OR |
| (s(2) AND sn(1) AND d(5) AND d(4)) | OR (s(1) AND sn(0) AND d(6) AND d(2)) | OR |
| (s(2) AND s(0) AND d(7) AND d(5)) | OR (s(2) AND s(1) AND d(7) AND d(6)); | | wherein s(n) represents the value of the n-th select input of the mux, sn(n) represents the inverse of s(n), and d(k) represents the value of the k-th data input of the mux. For example, in the case of the Gray code input selection sequence of FIG. 7, the data inputs d(0), d(1), . . . , d(7) of the above equation correspond respectively to D7, D0, D2, D1, D6, D5, D3, and D4.

As is apparent to a person skilled in the relevant art, the first eight terms of the above equation are concerned with selecting the output of the mux. The last eight terms ensure that internal mux glitches, as described above, do not appear during input transitions. Furthermore, having stable mux inputs and using a Gray code input selection sequence guarantee that the other two types of output glitches, as described above, do not occur.

The above output selection algorithm is optimized based on a priori knowledge of the input selection sequence of the mux. In other words, given an input selection sequence, the output selection algorithm is designed to provide a glitch-free mux output only for input transitions in accordance with the input selection sequence. Accordingly, the output selection algorithm is not concerned with providing a glitch-free output for input transitions not within the input selection sequence. This design choice of the present invention reduces the number of terms in the above output selection algorithm to a necessary minimum. Consequently, the physical size of the mux is also reduced.

Example Timing Diagram

Figure 9:
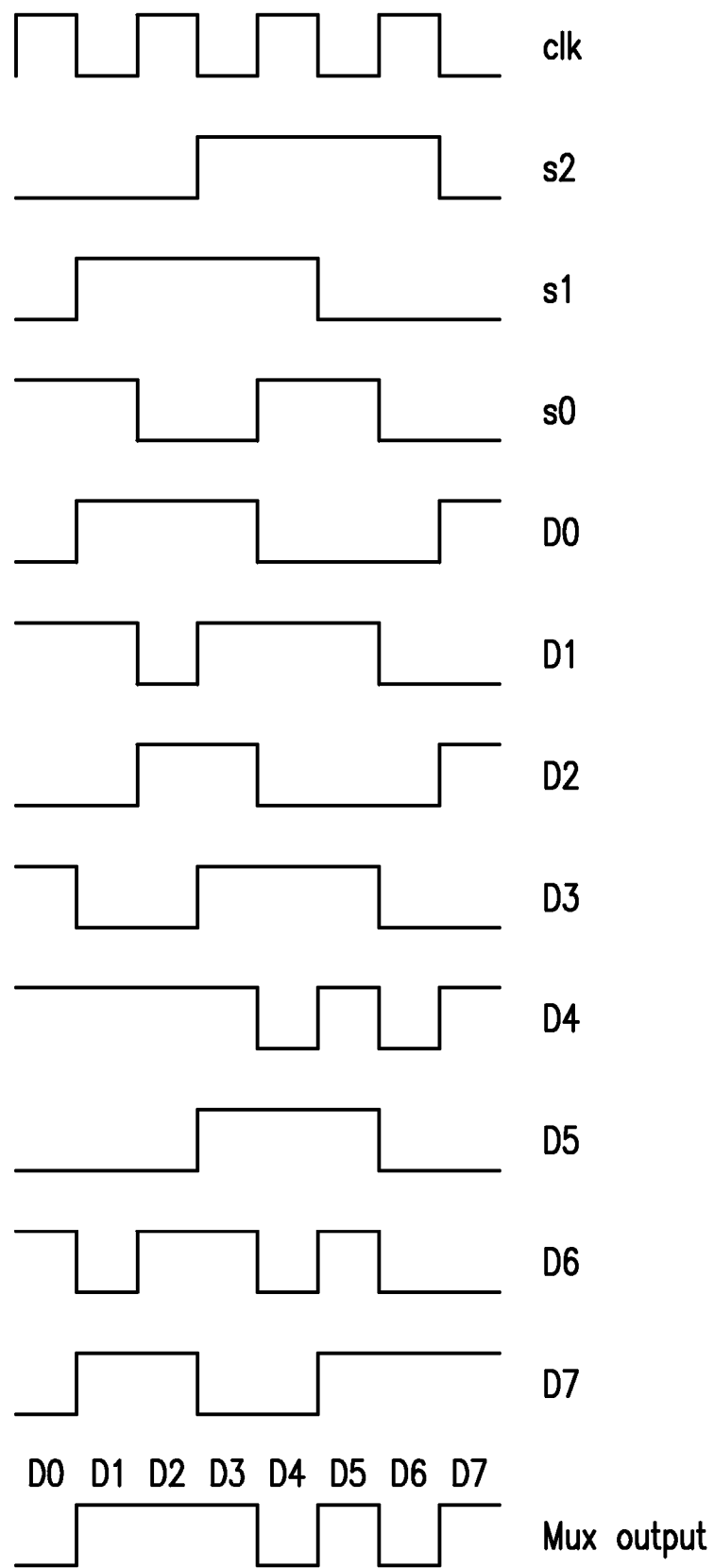
FIG. 9 is, an example timing diagram relating the input clock, the select inputs, the data inputs, and the mux output of the mux of FIG. 6.

FIG. 9 is an example timing diagram relating the input clock, the select inputs, the data inputs, and the mux output of mux 606. In the example of FIG. 9, the input selection sequence {S2,S1,S0} is in accordance with the Gray code input selection sequence illustrated in FIG. 7.

From FIG. 9, it can be noted that the input selection sequence {S2,S1,S0} transitions at every rising or falling edge of the input clock and that a single select input changes at every transition. The mux output is glitch-less and outputs a data byte every 4 cycles of the input clock. Data bits D0, . . . , D7 are exemplary sequences that are used for illustrative purposes only and do not necessarily correspond to actual sequences in implementation.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for serial encoding, comprising:

providing a glitch-less multiplexer (mux) having a plurality of mux data inputs, a plurality of select inputs and a mux output, wherein the mux output does not glitch due to a change of any single select input bit;

providing a plurality of latches, having latch data inputs and latch data outputs, wherein the latch data outputs are coupled to the plurality of mux data inputs;

providing an enabler, coupled to the latches;

providing a counter, coupled to the select inputs of the mux, wherein the counter transitions on either a rising or a falling edge of an input clock, and only a single counter state bit changes on a transition between any two consecutive states in a count sequence;

employing the enabler to enable and control the latches to update the latch data outputs at a time when the latch data inputs are not changing; and employing the counter to select one of the plurality of mux data inputs in a predetermined sequence for the mux output and control the enabler.

2. The method of claim 1 further comprising employing the counter to provide the mux with input selection values according to a Gray code sequence.

3. The method of claim 2 further comprising employing an output selection algorithm included in the mux and optimized based on a priori knowledge of the Gray code sequence to provide a glitch-less output only during input transitions in accordance with the Gray code sequence, thereby reducing the size of the mux.

4. The method of claim 3 wherein employing an output selection algorithm included in the mux and optimized based on a priori knowledge of the Gray code sequence to provide a glitch-less output only during input transitions in accordance with the Gray code sequence includes employing the output selection algorithm to select the mux output in accordance with the following:

Output = (sn(2) AND sn(1) AND sn(0) AND d(0)) OR (sn(2) AND sn(1) AND s(0) AND d(1)) OR (sn(2) AND s(1) AND sn(0) AND d(2)) OR (sn(2) AND s(1) AND s(0) AND d(3)) OR (s(2) AND sn(1) AND sn(0) AND d(4)) OR (s(2) AND sn(1) AND s(0) AND d(5)) OR (s(2) AND s(1) AND sn(0) AND d(6)) OR (s(2) AND s(1) AND s(0) AND d(7)) OR (sn(2) AND sn(1) AND d(1) AND d(0)) OR (sn(1) AND sn(0) AND d(4) AND d(0)) OR (sn(2) AND s(0) AND d(3) AND d(1)) OR (sn(2) AND s(1) AND d(3) AND d(2)) OR (s(2) AND sn(1) AND d(5) AND d(4)) OR (s(1) AND sn(0) AND d(6) AND d(2)) OR (s(2) AND s(0) AND d(7) AND d(5)) OR (s(2) AND s(1) AND d(7) AND d(6));

wherein s(n) represents a bit of an input selection value;
sn(n) represents the inverse of s(n); and
d(k) represents a bit of an input of the mux.

5. The method of claim 3 further comprising:
transitioning the counter at every edge of the input clock; and
outputting from the mux a bit at every edge of the input clock.

6. The method of claim 2 wherein employing the enabler to enable and control the latches to update the latch data outputs at a time when the latch data inputs are not changing includes employing the enabler to enable the latches based on the input selection values generated by the counter.

7. The method of claim 1 wherein employing the enabler to enable and control the latches to update the latch data outputs at a time when the latch data inputs are not changing includes employing the enabler to update only a subset of the latches while selecting another subset of the latches for output by the mux.

8. The method of claim 1 further comprising:
receiving data as input in parallel; and
outputting the data onto a serial communications link.

9. A method for serial encoding, comprising:
storing a plurality of input bits;
generating an input selection sequence by employing a counter that transitions on either a rising or a falling edge of an input clock, and for which a single counter state bit to change on a transition between any two consecutive states in a count sequence; and
outputting serially said plurality of input bits according to said input selection sequence, wherein outputting serially includes outputting serially without glitches during input transitions in said input selection sequence.

10. The method of claim 9 further comprising updating the plurality of stored input bits.

11. The method of claim 9 wherein generating an input selection sequence includes generating a Gray code sequence.

12. The method of claim 11 wherein outputting serially includes outputting serially based on an output selection algorithm optimized based on a priori knowledge of the Gray code sequence.

13. The method of claim 12 wherein outputting serially said plurality of input bits according to said input selection sequence includes outputting serially without glitch only during input transitions in accordance with the Gray code sequence.

14. The method of claim 9 wherein outputting serially said plurality of input bits according to said input selection sequence includes outputting a bit at every edge of the input clock.

15. A non-transitory computer program product, comprising: computer readable medium comprising:
code for causing serial encoding by employing:
a glitch-less multiplexer (mux) having a plurality of mux data inputs, a plurality of select inputs and a mux output, wherein the mux output does not glitch due to a change of any single select input bit;
a plurality of latches, having latch data inputs and latch data outputs, wherein the latch data outputs are coupled to the plurality of mux data inputs;
an enabler, coupled to the latches;
a counter, coupled to the select inputs of the mux, wherein the counter transitions on either a rising or a falling edge of an input clock, and only a single counter state bit changes on a transition between any two consecutive states in a count sequence, the code comprising:
code for causing the enabler to enable and control the latches to update the latch data outputs at a time when the latch data inputs are not changing; and
code for causing the counter to select one of the plurality of mux data inputs in a predetermined sequence for the mux output and control the enabler.

16. The non-transitory computer readable medium of claim 15 further comprising code for causing the counter to provide the mux with input selection values according to a Gray code sequence.

17. The non-transitory computer-readable medium of claim 16 further comprising code for causing a glitch-less to be provided from the mux only during input transitions in accordance with the Gray code sequence.

18. The non-transitory computer readable medium of claim 17 further comprising code for causing the mux output to be selected in accordance with the following:
Output =(sn(2) AND sn(1) AND sn(0) AND d(0)) OR (sn(2) AND sn(1) AND s(0) AND d(1)) OR (sn(2) AND s(1) AND sn(0) AND d(2)) OR (sn(2) AND s(1) AND s(0) AND d(3)) OR (s(2) AND sn(1) AND sn(0) AND d(4)) OR (s(2) AND sn(1) AND s(0) AND d(5)) OR (s(2) AND s(1) AND sn(0) AND d(6)) OR (s(2) AND s(1) AND s(0) AND d(7)) OR (sn(2) AND sn(1) AND d(1) AND d(0)) OR (sn(1) AND sn(0) AND d(4) AND d(0)) OR (sn(2) AND s(0) AND d(3) AND d(1)) OR (sn(2) AND s(1) AND d(3) AND d(2)) OR (s(2) AND sn(1) AND d(5) AND d(4)) OR (s(1) AND sn(0) AND d(6) AND d(2)) OR (s(2) AND s(0) AND d(7) AND d(5)) OR (s(2) AND s(1) AND d(7) AND d(6));
wherein s(n) represents a bit of an input selection value;
sn(n) represents the inverse of s(n); and
d(k) represents a bit of an input of the mux.

19. The non-transitory computer readable medium of claim 17 further comprising code for causing:
the counter to transition at every edge of the input clock; and
a bit to be output from the mux at every edge of the input clock.

20. The non-transitory computer readable medium of claim 16 further comprising code for causing the enabler to enable the latches based on the input selection values generated by the counter.

21. The non-transitory computer readable medium of claim 15 further comprising code for causing the enabler to update only a subset of the latches while selecting another subset of the latches for output by the mux.

22. The non-transitory computer readable medium of claim 15 further comprising code for causing:
data to be receiving as input in parallel; and
data to be output onto a serial communications link.

23. A non-transitory computer readable medium comprising:
code for causing serial encoding, the computer code comprising:
code for causing a plurality of inputs bits to be stored;
code for causing an input selection sequence to be generated by employing a counter that transitions on either a rising or a falling edge of an input clock, and for which a single counter state bit changes on a transition between any two consecutive states in a count sequence; and
code for causing said plurality of input bits to be output serially according to said input selection sequence, wherein outputting serially includes outputting serially without glitches during input transitions in said input selection sequence.

24. The non-transitory computer readable medium of claim 23 further comprising code for causing the plurality of stored input bits to be updated.

25. The non-transitory computer-readable medium of claim 23 further comprising code for causing a Gray code sequence to be generated.

26. The non-transitory computer readable medium of claim 25 further comprising code for causing serial output based on an output selection algorithm optimized based on a priori knowledge of the Gray code sequence.

27. The non-transitory computer readable medium of claim 26 further comprising code for causing said plurality of input bits to be output serially without glitch only during input transitions in accordance with the Gray code sequence.

28. The non-transitory computer readable medium of claim 23 further comprising code for causing a bit to be output at every edge of the input clock.

* * * * *